(12) United States Patent
Kita et al.

(10) Patent No.: US 7,042,136 B2
(45) Date of Patent: May 9, 2006

(54) PIEZOELECTRIC THIN-FILM ELEMENT AND A MANUFACTURING METHOD THEREOF

(75) Inventors: Hiroyuki Kita, Osaka (JP); Hirokazu Uchiyama, Higashiosaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/014,988

(22) Filed: Dec. 20, 2004

(65) Prior Publication Data

US 2005/0099100 A1 May 12, 2005

Related U.S. Application Data

(62) Division of application No. 10/234,110, filed on Sep. 5, 2002.

(30) Foreign Application Priority Data

Sep. 7, 2001 (JP) ............ P 2001-271749

(51) Int. Cl.
*H01L 41/83* (2006.01)
(52) U.S. Cl. .................. 310/320; 310/366
(58) Field of Classification Search .......... 310/320, 310/321, 365–369
See application file for complete search history.

(56) References Cited

U.S. PATENT DOCUMENTS

| | | | |
|---|---|---|---|
| 2,468,537 A | 4/1949 | Benioff | 366/114 |
| 2,859,346 A | 11/1958 | Firestone et al. | 331/37 |
| 4,468,582 A | 8/1984 | Fujiwara et al. | 310/312 |
| 4,549,107 A | 10/1985 | Kaneko et al. | 310/327 |
| 5,317,152 A | 5/1994 | Takamatsu et al. | 250/306 |
| 5,410,208 A | 4/1995 | Walters et al. | 310/334 |
| 5,568,118 A | 10/1996 | Andersen et al. | 340/384.1 |
| 5,616,982 A | 4/1997 | Um et al. | 310/328 |

(Continued)

FOREIGN PATENT DOCUMENTS

EP     1 067 609     1/2001

(Continued)

OTHER PUBLICATIONS

Takao Kumihashi, Hiroshi Kawakami, Kazuyoshi Torii, Mitsuo Suga, Tokuo Kure; Proceedings of Second International Symposium on Plasma Process Induced Damage: "Dry Etching Damage in Pt/Pb(Zr, Ti)$O_3$/Pt Capacitors Patterned by a Single Photolithography Process Step"; May 1997; pp. 221-224.

*Primary Examiner*—Thomas M. Dougherty
(74) *Attorney, Agent, or Firm*—Wenderoth, Lind & Ponack, L.L.P.

(57) ABSTRACT

To provide a piezoelectric thin-film element small in leak current between electrode metal films and its manufacturing method are presented, the piezoelectric thin-film element includes at least one unit laminated body composed of a piezoelectric thin-film having a mutually facing first surface and second surface, a first electrode metal film on the first surface, and a second electrode metal film on the second surface, in which an electrode separation surface composed of a piezoelectric thin-film surface parallel to the first surface is provided between the first electrode metal film and second electrode metal film.

9 Claims, 34 Drawing Sheets

U.S. PATENT DOCUMENTS

| | | | |
|---|---|---|---|
| 6,191,524 B1 | 2/2001 | Sasaki et al. | 310/367 |
| 6,307,447 B1 | 10/2001 | Barber et al. | 333/189 |
| 6,420,202 B1 | 7/2002 | Barber et al. | 438/52 |
| 6,478,412 B1 | 11/2002 | Hanabata | 310/312 |
| 6,817,073 B1* | 11/2004 | Uchiyama et al. | 29/25.35 |
| 6,903,497 B1* | 6/2005 | Uchiyama et al. | 310/365 |
| 2002/0048124 A1 | 4/2002 | Kuwajima et al. | 360/294.4 |
| 2002/0121840 A1 | 9/2002 | Larson et al. | 310/312 |
| 2003/0057804 A1* | 3/2003 | Uchiyama et al. | 310/311 |
| 2003/0062804 A1* | 4/2003 | Uchiyama | 310/328 |
| 2003/0155845 A1* | 8/2003 | Uchiyama et al. | 310/367 |
| 2003/0168935 A1* | 9/2003 | Ogawa et al. | 310/328 |
| 2004/0183403 A1* | 9/2004 | Uchiyama et al. | 310/328 |

FOREIGN PATENT DOCUMENTS

| | | | |
|---|---|---|---|
| EP | 1 148 560 | | 10/2001 |
| EP | 1 202 273 | | 5/2002 |
| JP | 11-105277 | * | 4/1999 |
| JP | 2000-150825 | | 5/2000 |
| JP | 2001-168411 | | 6/2001 |
| JP | 2002-217676 | * | 8/2002 |
| JP | 2003-133890 | | 5/2003 |
| WO | 01/26167 | | 4/2001 |

* cited by examiner

PIEZOELECTRIC THIN-FILM ELEMENT AND A MANUFACTURING METHOD THEREOF

This is a divisional application of U.S. patent application Ser. No. 10/234,110, filed Sep. 5, 2002.

BACKGROUND OF THE INVENTION

1. Field of the Invention

The present invention relates to a piezoelectric element and its manufacturing method, and more particularly to a piezoelectric thin-film element used in an actuator or the like for precise position control of sub-micron level and its manufacturing method.

2. Prior Art

FIG. 23C is a sectional view of a general piezoelectric thin-film element 90. In this piezoelectric thin-film element 90, both principal surfaces of a piezoelectric thin-film 92 are coated with electrode metal films 94 and 96. When a voltage is applied between the electrode metal films 94 and 96, the piezoelectric thin-film 92 expands and contracts in the in-plane direction. The piezoelectric thin-film element 90 can be used as an actuator for controlling the position by making use of variation by such expanding and contracting motion.

A general manufacturing method of such a piezoelectric thin-film element 90 is explained. First, as shown in FIG. 23A, a piezoelectric thin-film 92 and an electrode metal film 94 are deposited in this sequence on an electrode metal film 96. Then, as shown in FIG. 23B, dry etching is performed by forming a mask 98 on the electrode metal film 94. As a result, the electrode metal films 94 and 96 and the piezoelectric thin-film 92 in a region not covered with the mask (indicated by arrow in FIG. 23B) are removed by etching, and a piezoelectric thin-film element 90 in a desired shape as shown in FIG. 23C is fabricated.

When the piezoelectric thin-film element 90 is fabricated by dry etching, as shown in FIG. 23C, a thin film of a side wall deposit 88 is formed on the side of the piezoelectric thin-film element 90. Components of this side wall deposit 88 include components of piezoelectric thin-film, chemical polymerization products of etching gas, and components of electrode metal film.

As the etching depth becomes greater, etching by-products are generated massively in the dry etching process, and more side wall deposits 88 are formed on the side of the piezoelectric thin-film element 90. Therefore, when the piezoelectric thin-film 92 is thick, or when the piezoelectric thin-film element 90 is composed of multiple layers of piezoelectric thin-film 92 which is thin, etching depth must be further increased, and the amount of side wall deposits 88 formed on the side of the piezoelectric thin-film element 90 increases.

Since a conductive substance is contained in the side wall deposits 88, when side wall deposits 88 are adhered on the side wall of the piezoelectric thin-film element 90, insulation between the electrode metal films 94 and 96 declines, and the electrode metal films 94 and 96 are short-circuited, and electric field is not applied to the piezoelectric thin-film 92, and thereby the piezoelectric thin-film element 90 fails to function. Accordingly, the product yield in the manufacturing process cannot be enhanced sufficiently. In addition, the multilayer lamination of piezoelectric thin-films causes the displacement of the actuator to increase, and although it is indispensable depending on the purpose of use, it was difficult to manufacture the piezoelectric element composed of multiple layers of piezoelectric elements with high reliability and high yield.

SUMMARY OF THE INVENTION

The invention is devised to solve such problems, and it is hence an object thereof to present a piezoelectric thin-film element capable of preventing a lowering of insulation between electrode metal films, and having a small leak current, and its manufacturing method.

The piezoelectric thin-film element of the invention comprises at least one unit laminated body composed of a piezoelectric thin-film which has a first and a second surface opposed to each other, a first electrode metal film on the first surface and a second electrode metal film on the second surface. The piezoelectric thin-film element is characterized in that the unit laminated body has an electrode separation surface parallel to the first surface between the first electrode metal film and second electrode metal film.

The piezoelectric thin-film element in the first aspect of the invention of such configuration has the electrode separation surface parallel to the first surface, that is, vertical to the etching direction in the manufacturing process. Therefore in the dry etching process in the manufacturing process, conductive side wall deposits adhered on the wall parallel to the etching direction are electrically isolated from the electrode separation surface. As a result, short-circuiting of the first electrode metal film and second electrode metal film through the side wall deposits can be prevented, and the insulation between the first electrode metal film and second electrode metal film can be enhanced. Therefore, according to the piezoelectric thin-film element in the first aspect of the invention, the leak current is extremely small, and the reliability is enhanced.

Herein, the width of the electrode separation surface should be at least greater than the thickness of side wall deposits adhered on the side wall in the dry etching process, but preferably, in consideration of the position precision (alignment precision) when forming a mask to be used in the dry etching process, it is set at the value larger than the sum of the thickness of side wall deposits and the position tolerance when forming the mask.

In the piezoelectric thin-film element in the first aspect, the electrode separation surface is parallel to the first surface, but in this specification, however, it does not mean a strict parallel surface geometrically, but means a surface not allowing adhesion of side wall deposits in the dry etching process.

Dry etching in the specification includes reactive ion etching (RIE) for etching by discharging by applying a high frequency voltage to the etching gas composed of, for example, rare gas such as Ar, or reactive gas including atoms of O, F or Cl, and ion beam etching for etching by emitting an ion beam to the sample by using ions of the etching gas in a beam.

In the piezoelectric thin-film element in the first aspect of the invention, the electrode separation surface may be disposed at the side face of the piezoelectric thin-film, or the electrode separation surface may be composed of an outer circumferential portion of the second surface positioned outside of the second electrode metal film.

The piezoelectric thin-film positioned beneath the electrode separation surface does not contribute to expansion or contraction of the piezoelectric element, but may rather impede the expanding or contracting action of the piezoelectric thin-film, and it is preferred to reduce the thickness of the piezoelectric thin-film positioned beneath the electrode separation surface. Therefore by disposing the electrode separation surface at the side face of the piezoelectric thin-film, the thickness of the piezoelectric thin-film positioned beneath this electrode separation surface can be reduced, and hence the electrode separation surface is preferred to be disposed at the side face of the piezoelectric thin-film.

The width of the electrode separation surface of the piezoelectric thin-film is preferred to be 0.1 µm or more in order to insulate between the first electrode metal film and second electrode metal film more securely, and moreover it is preferred to be 1 µm or more in order to insulate between the first electrode metal film and second electrode metal film further securely.

Still more, considering the processing precision in the manufacturing process, the set value of the width of the electrode separation surface is preferred to be 3 µm or more, and more preferably about 5 µm.

Since the peripheral region of the piezoelectric thin-film (the region immediately beneath the electrode separation surface) is a portion not functioning as the piezoelectric, it is not preferred to widen the width of the electrode separation surface more than necessary.

From such viewpoint, the upper limit of the width of the peripheral region of the piezoelectric thin-film is preferred to be 10% or less of square root of S where S is the area contacting with the electrode metal film at both sides out of the area of the piezoelectric thin-film. In the entire region of the electrode separation surface, when the width of the electrode separation surface exceeds 10%, the area of the portion operating actually out of the piezoelectric thin-film decreases nearly to half, and the performance as the actuator is lowered.

The invention is particularly effective in the piezoelectric thin-film element composed by laminating two piezoelectric thin-films. That is, the piezoelectric thin-film element according to a second aspect of the invention comprises a first unit laminated body and a second unit laminated body. The first unit laminated body is composed of a first piezoelectric thin-film having a first surface and a second surface opposed each other, a first electrode metal film on the first surface and a second electrode film on the second surface. The second unit laminated body is composed of a second piezoelectric thin-film having a third surface and a fourth surface opposed each other, a third electrode metal film on the third surface and a fourth electrode film on the fourth surface. The first unit laminated body and second unit laminated body are bonded to each other, with the second electrode metal film and third electrode metal film opposite to each other.

The piezoelectric thin-film element of the second aspect is characterized in that the first unit laminated body has a first electrode separation surface parallel to the first surface which is disposed between the first electrode metal film and second electrode metal film, and that the unit laminated body has a second electrode separation surface parallel to the third surface which is disposed between the third electrode metal film and fourth electrode metal film.

In the piezoelectric thin-film element of the second aspect, side wall deposits adhered on the side wall of the first piezoelectric thin-film can be separated electrically from the electrode separation surface, and side wall deposits adhered on the side wall of the second piezoelectric thin-film can be separated electrically from the electrode separation surface. Therefore the insulation between the electrode metal films can be enhanced.

Accordingly, the leak current between the first electrode metal film and second electrode metal film and leak current between the third electrode metal film and fourth electrode metal film can be decreased, so that the reliability of the piezoelectric thin-film element of multilayer structure can be enhanced.

Also, in such piezoelectric thin-film element of multilayer structure, due to the same reasons as above, the thickness of the first and second piezoelectric thin-films in the peripheral region is preferred to be thin.

The width of the electrode separation surface is preferred to be 0.1 µm or more.

In the piezoelectric thin-film element in the second aspect of the invention, the second electrode metal film and third electrode metal film may be bonded through an insulating adhesive layer, and in this case, for example, the second electrode metal film and third electrode metal film may be connected by way of a through-hole formed in the adhesive layer.

In this case, the through-hole is formed in a recess provided by removing the fourth electrode metal film and second piezoelectric thin-film so as to reach up to the third electrode metal film, and this recess is preferred to have an electrode separation surface parallel to the third surface at the inner circumferential side of the second piezoelectric thin-film. As a result, side wall deposits adhered on the inner circumference of the second piezoelectric thin-film can be electrically isolated.

Further, in the piezoelectric thin-film element in the second aspect of the invention, the through-hole may be also formed in a notch provided by removing the fourth electrode metal film and second piezoelectric thin-film so as to reach up to the third electrode metal film, and in this case, this notch is preferred to have an electrode separation surface parallel to the third surface at the side face of the second piezoelectric thin-film. As a result, side wall deposits adhered on the side face of the second piezoelectric thin-film at the notch can be electrically isolated.

The actuator of the present invention comprises a pair of piezoelectric elements expanding and contracting in mutually parallel directions, in which each piezoelectric element has a first unit laminated body and a second unit laminated body. The first unit laminated body is composed of a first piezoelectric thin-film having a first surface and a second surface opposed each other, a first electrode metal film on the first surface and a second electrode film on the second surface. The second unit laminated body is composed of a second piezoelectric thin-film having a third surface and a fourth surface, a third electrode metal film on the third surface and a fourth electrode film on the fourth surface. The first unit laminated body and the second unit laminated body are bonded to each other, with the second electrode metal film and third electrode metal film opposite to each other.

The actuator of the present invention is characterized in that the first unit laminated body has a first electrode separation surface parallel to the first surface which is disposed between the first electrode metal film and second electrode metal film, and that the second unit laminated body has a second electrode separation surface parallel to the third surface which is disposed between the third electrode metal film and the fourth electrode metal film.

In the actuator of the invention having such configuration, the leak current is less and the reliability is higher.

Also, in the actuator of the invention, the second electrode metal film and third electrode metal film of the piezoelectric element may be bonded through an insulating adhesive layer, and the second electrode metal film and third electrode metal film may be connected by way of a through-hole formed in the adhesive layer.

In the actuator of the invention, the through-hole is formed in a recess provided by removing the fourth electrode metal film and second piezoelectric thin-film so as to reach up to the third electrode metal film, and in this case, this recess is preferred to have an electrode separation surface parallel to the third surface at the inner circumferential side of the second piezoelectric thin-film, so as to separate electrically from side wall deposits adhered on the inner circumferential side.

Further, in the actuator of the invention, the through-hole may be also formed in a notch provided by removing the fourth electrode metal film and second piezoelectric thin-film so as to reach up to the third electrode metal film, and in this case, this notch is preferred to have an electrode separation surface parallel to the third surface on the side face of the second piezoelectric thin-film, so as to separate electrically from side wall deposits adhered on the side face.

Moreover, in the actuator of the invention, it may be also designed to connect mutually between an electrode metal film for connecting the second electrode metal film and third electrode metal film formed in the through-hole in one of the pair of piezoelectric elements, and an electrode metal film for connecting the second electrode metal film and third electrode metal film formed in the through-hole in the other piezoelectric element.

As a result, the pair of piezoelectric elements can be controlled synchronously.

A first manufacturing method of piezoelectric thin-film element of the invention is a method for manufacturing a piezoelectric thin-film element by processing a laminated body laminating a lower electrode metal film, a piezoelectric thin-film, and an upper electrode metal film into a specified shape by dry etching.

The first manufacturing method comprises;

a first step of forming a first mask of a specified shape on the upper electrode metal film, and dry etching until the piezoelectric thin-film side is exposed to the outside of the first mask, and removing the first mask, a second step of forming a second mask so as to cover the upper electrode metal film processed in the above specified shape by extending to part of the piezoelectric thin-film around the upper electrode metal film, and removing the piezoelectric thin-film and lower electrode metal film positioned outside of the second mask by dry etching.

In this first manufacturing method of the invention thus designed, the second mask is formed so as to cover the side wall deposits adhered on the side wall of the piezoelectric thin-film at the first etching step by forming the second mask so as to cover the upper electrode metal film and part of the piezoelectric thin-film around the upper electrode metal film. Therefore the side wall deposits adhered on the side wall at the first etching step and the side wall deposits adhered on the side wall at the second etching step can be electrically isolated.

According to the first manufacturing method, short circuit between the first electrode metal film and second electrode metal film can be prevented, and the insulation between the first electrode metal film and second electrode metal film can be enhanced, so that the piezoelectric thin-film element can be manufactured at high yield.

In the first manufacturing method of piezoelectric thin-film element of the invention, at the first etching step, preferably, the piezoelectric thin-film should be removed up to the middle in the thickness direction by etching.

The manufacturing method of the invention brings about a notable leak current reducing effect when manufacturing an element having plural piezoelectric thin films.

A second manufacturing method of piezoelectric thin-film element of the invention is a method for manufacturing piezoelectric thin-film element by processing a laminated body composed of two unit laminated bodies, each laminating a first electrode metal film, a piezoelectric thin-film, and a second electrode metal film, being bonded through an adhesive layer so that the second electrode metal film of one unit laminated body may be opposite to the first electrode metal film of other unit laminated body, into a specified shape by dry etching.

The second manufacturing method comprises a lower etching step of processing the first electrode metal film into a specified shape, aside from an upper etching step of processing the second electrode metal film into a specified shape, when processing each unit laminated body, and the lower etching step is characterized by forming a mask on the second electrode metal film and part of the piezoelectric thin-film exposed to its periphery, and removing the piezoelectric thin-film and first electrode metal film positioned outside of the mask.

According to the second manufacturing method, having plural piezoelectric thin films, since the total thickness of the piezoelectric thin-film is increased, if more side wall deposits may be adhered in the etching process, the side wall deposits can be electrically isolated between the first electrode metal film and second electrode metal film. As a result, short circuit between the first electrode metal film and the second electrode metal film can be prevented, and the insulation between the first electrode metal film and the second electrode metal film can be enhanced, so that the piezoelectric thin-film element can be manufactured at high yield.

In the second manufacturing method, the lower etching step of processing the first electrode metal film of the other unit laminated body and the upper etching step of processing the second electrode metal film of the one unit laminated body may be a continuous etching process by the same mask.

In the first and second manufacturing methods of the invention, the piezoelectric thin-film is deposited by sputtering method such as magnetron sputter, CVD, a sol-gel method, or an evaporation method of piezoelectric thin-film material by heating.

DETAILED DESCRIPTION OF THE PREFERRED EMBODIMENTS

First Embodiment

Figure 1A:
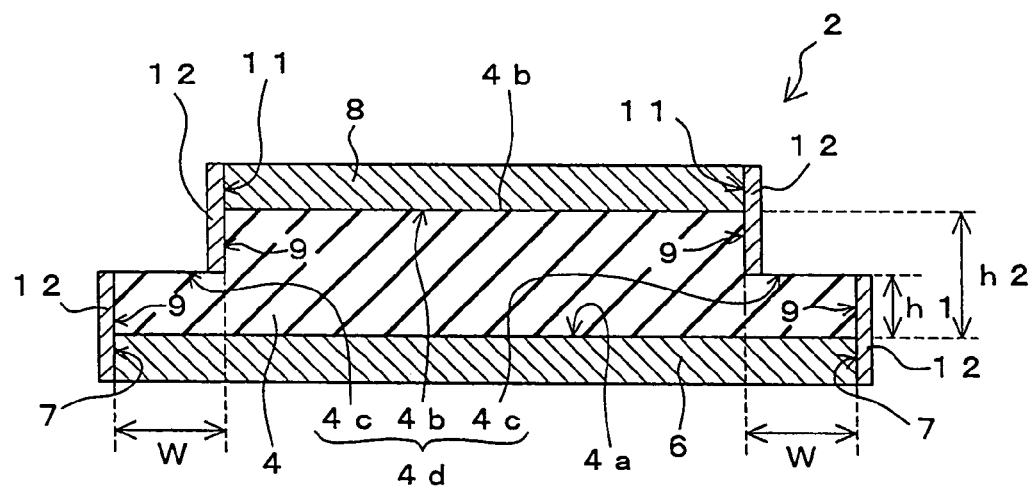
FIG. 1A and FIG. 1B are sectional views showing a piezoelectric thin-film element in a first embodiment of the invention.

FIG. 1A is a sectional view showing an embodiment of a piezoelectric thin-film element according to the invention. The contour (shape) of a piezoelectric thin-film element 2 of the embodiment is formed by dry etching a laminated body composed of a first electrode metal film 6, a piezoelectric thin-film 4 formed on the first electrode metal film 6, and a second electrode metal film 8 formed on the piezoelectric thin-film 4. In such piezoelectric thin-film element 2, when a voltage is applied between the first electrode metal film 6 and second electrode metal film 8, the piezoelectric thin-film 4 expands or contracts in the in-plane direction, and by making use of such motion, it is used in an actuator or the like.

In the piezoelectric thin-film element 2, the piezoelectric thin-film 4 has a lower surface 4a and an upper surface 4d facing the lower surface 4a. The first electrode metal film 6 is formed on the entire surface of the lower surface 4a of the piezoelectric thin-film 4, but the area of the second electrode metal film 8 on the upper surface 4d is smaller than the area of the first electrode metal film 6, and the second electrode metal film 8 is formed in a central region 4b of the upper surface 4d, but the second electrode metal film 8 is not formed in a peripheral region 4c surrounding the central region 4b, and hence the piezoelectric thin-film 4 is exposed. In the piezoelectric thin-film 4, a step difference is formed in the peripheral region 4c so that the thickness h1 in the peripheral region 4c may be smaller than the thickness h2 in the central region 4b.

Thus, in the piezoelectric thin-film element 2, the outer periphery of the second electrode metal film 8 is inside of the outer periphery of the piezoelectric thin-film 4, and the peripheral region 4c exposing the surface of the piezoelectric thin-film 4 provided between the outer periphery of the second electrode metal film 8 and the outer periphery of the piezoelectric thin-film 4.

When a dry etching process is employed for forming the outer periphery of the piezoelectric thin-film element 2, side wall deposits 12 are formed in a thin film at the side face of the piezoelectric thin-film element 2. Side wall deposits 12 are etching by-products occurring in the dry etching process, and are composed of materials of electrode metal film removed by etching, chemically polymerized products of etching gas, and compounds of etching gas and electrode metal film or the like, and contain conductive substances.

In the piezoelectric thin-film element 2 of the embodiment, in the dry etching process, side wall deposits 12 are adhered on a side face 7 of the first electrode metal film 6, a side face 9 of the piezoelectric thin-film 4, and a side face 11 of the second electrode metal film 8, but side wall deposits 12 are not adhered on the peripheral region 4c. As described later in the manufacturing method of piezoelectric thin-film element 2, this is because the peripheral region 4c of the piezoelectric thin-film 4 is a plane substantially vertical to the advancing direction of dry etching.

Thus, since the side wall deposits 12 of the piezoelectric thin-film element are isolated by the peripheral region 4c, the first electrode metal film 6 and second electrode metal film 8 are not short-circuited by way of the side wall deposits 12 containing conductive substances. Therefore, the insulation between the first electrode metal film 6 and second electrode metal film 8 can be enhanced, and the reliability of the piezoelectric thin-film element is improved.

Figure 2A:
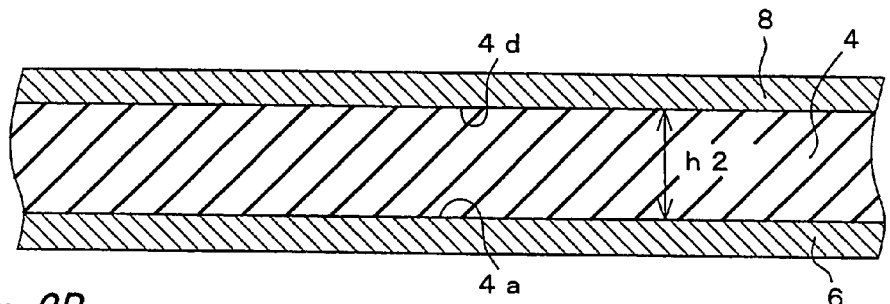
FIG. 2A to FIG. 2D are sectional views showing a manufacturing method of piezoelectric thin-film element in the first embodiment of the invention.
Figure 2B:
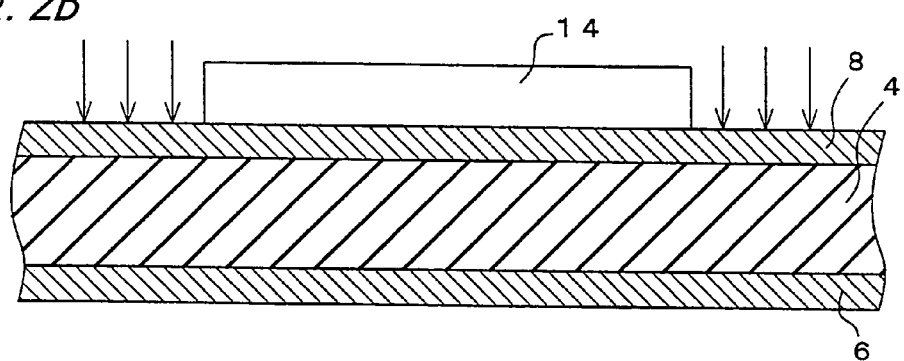
Figure 2C:
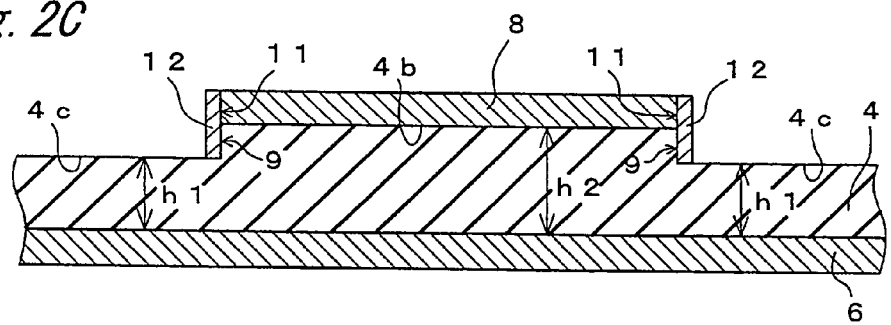

A manufacturing method of such piezoelectric thin-film element 2 is explained by referring to FIGS. 2A to C.

First, as shown in FIG. 2A, a piezoelectric thin-film 4 and a second electrode metal film 8 are deposited sequentially on a first electrode metal film 6. The forming method of the piezoelectric thin-film 4 includes various methods except powder sintering method. For example, sputtering method, CVD, laser ablation, a sol-gel method, or an evaporation of piezoelectric thin-film material by heating may be employed. The powder sintering method is excluded because, in the case of powder sintering method, using a green sheet of piezoelectric powder material makes it possible to form the contour of the piezoelectric thin-film element by cutting it mechanically, or cutting mechanically after sintering the powder, and more costly dry etching is rarely employed.

Next, as shown in FIG. 2B, a first etching mask 14 of a specified shape is formed on the second electrode metal film 8. The first etching mask 14 can be formed by, for example, photolithography using photoresist. By dry etching with etching gas, the second electrode metal film 8 in a region (indicated by arrow in FIG. 2B) not covered with the first etching mask 14 can be removed by etching, and further part of the piezoelectric thin-film 4 is removed by etching until the thickness of the piezoelectric thin-film 4 may become h1 (first etching step). After etching, the first etching mask 14 is removed.

By this first dry etching step, as shown in FIG. 2C, a central region 4b covered with the second electrode metal film 8, and a peripheral region 4c surrounding the central region 4b and exposing the piezoelectric thin-film 4 are formed on the upper surface 4d of the piezoelectric thin-film 4. A step difference is formed in the peripheral region 4c, and the thickness h1 of the piezoelectric thin-film 4 in the peripheral region 4c is smaller than the thickness h2 of the piezoelectric thin-film 4 in the central region 4b.

As a result of this first dry etching step, etching by-products are generated, such as electrode metal film removed by etching, chemically polymerized products of etching gas, and compounds of etching gas and electrode metal film. They are adhered on the side face 11 of the second electrode metal film 8 and side face 9 of the piezoelectric thin-film 4, thereby forming a thin film of side wall deposits 12. The peripheral region 4c of the piezoelectric thin-film is a plane substantially vertical to the advancing direction of etching, that is, the impinging plane of the ion particles generated from the etching gas, and side wall deposits 12 are not formed.

Figure 2D:
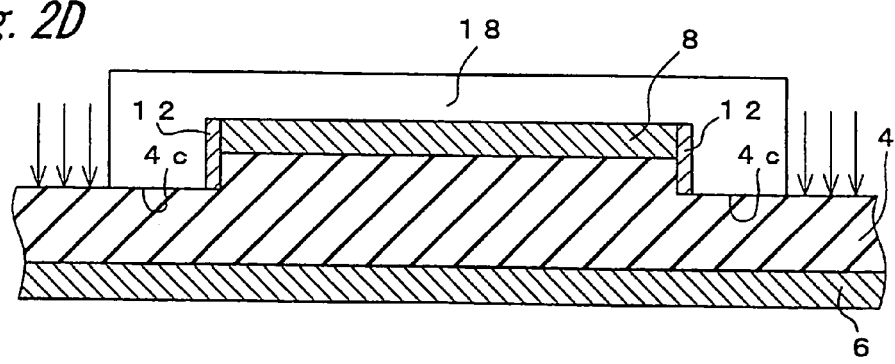

After the first dry etching step, further dry etching step is executed. First, as shown in FIG. 2D, a second etching mask 18 is formed on the remaining second electrode metal film 8 covered with the mask and not removed by etching. This second etching mask 18 is wider in area than the first etching mask 14, and therefore the second electrode metal film 8 and part of the peripheral region 4c of the piezoelectric thin-film 4 are covered with the second etching mask 18.

By dry etching same as in the first dry etching step, in the region (indicated by arrow in FIG. 2D) not covered with the second etching mask 18, the piezoelectric thin-film 4 of thickness h1 and the first electrode metal film 6 are removed by etching (second dry etching step). After the second dry etching step, the second etching mask 18 is removed, and a piezoelectric thin-film element 2 as shown in FIG. 1A is completed.

At the second dry etching step, same as at the first etching step, etching by-products are generated, and as shown in FIG. 1A, and side wall deposits 12 are adhered on the newly formed side face 9 of the piezoelectric thin-film 4 and side face 7 of the first electrode metal film 6.

When a piezoelectric thin-film element is fabricated in the explained method, in the contour of the piezoelectric thin-film element 2, the peripheral region 4c free from side wall deposits can be formed on the upper surface 4d of the piezoelectric thin-film 4. Therefore, since the side wall deposits 12 adhered on the side face 7 of the first electrode metal film 6 and the side face 9 of its consecutive piezoelectric thin-film 4, and the side wall deposits 12 adhered on the side face 11 of the second electrode metal film 8 and the side face 9 of its consecutive piezoelectric thin-film 4 are isolated by the peripheral region 4c, and hence the first electrode metal film 6 and second electrode metal film 8 are not short-circuited through the side wall deposits 12, and thereby the insulation between the first electrode metal film 6 and second electrode metal film 8 can be enhanced. As a result, the reliability of the piezoelectric thin-film element is improved, and the yield of products in the manufacturing process can be also enhanced.

In FIGS. 1 and 2, a substrate for supporting the piezoelectric thin-film element is not shown, but if necessary, the piezoelectric thin-film element may be supported by a certain substrate.

Figure 1B:
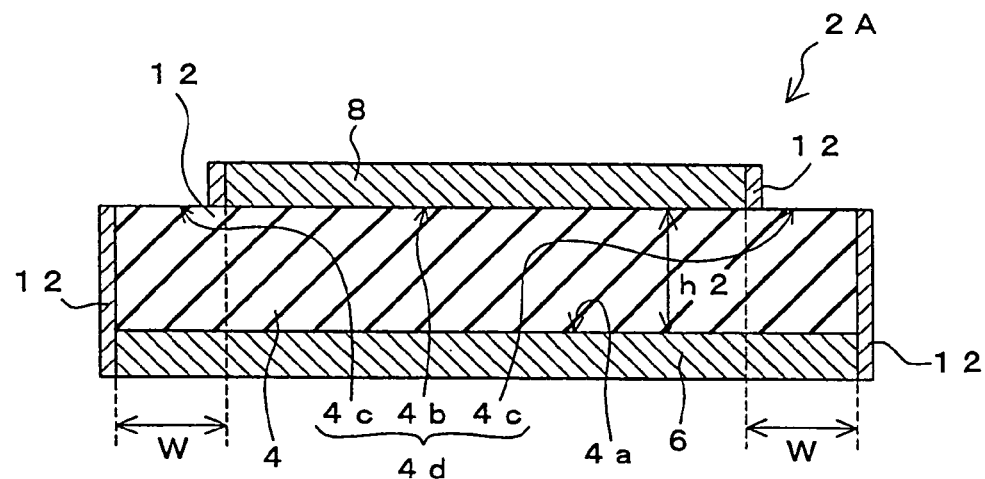

The piezoelectric thin-film element of the embodiment may be also fabricated like a piezoelectric thin-film element 2A shown in FIG. 1B, in which the peripheral region 4c and upper surface 4d are consecutive so as to be positioned on a same plane, in other words, the peripheral region 4c may be exposed without forming a step difference between the peripheral region 4c of the piezoelectric thin-film 4 and the upper surface 4a of the piezoelectric thin-film 4. In this piezoelectric thin-film element 2A, same as in the piezoelectric thin-film element 2 in FIG. 1A, the side wall deposits 12 of the piezoelectric thin-film element are isolated by the peripheral region 4c free from side wall deposits 12, and the first electrode metal film 6 and second electrode metal film 8 are not short-circuited through the side wall deposits 12, and thereby the insulation between the first electrode metal film 6 and second electrode metal film 8 can be enhanced.

When fabricating the piezoelectric thin-film element 2A in FIG. 1B, at the first etching step in FIG. 2B, the etching condition should be set so that the piezoelectric thin-film 4 may not be removed by etching by defining the etching depth at the film thickness of the second electrode metal film 8. However, the region of the piezoelectric thin-film 4 functioning as piezoelectric is a part of the piezoelectric thin-film 4 covered with the electrode metal film for both surfaces, and the peripheral region 4c not covered with the electrode metal film does not function as piezoelectric element. If the thickness of the peripheral region 4c not functioning as piezoelectric element is great, expanding or contracting motion of the piezoelectric thin-film 4 may be impeded. Therefore, the thickness of the peripheral region 4c is preferred to be thin, same as in the piezoelectric thin-film element 2 in FIG. 1A.

The width W of the peripheral region 4c of the piezoelectric thin-film 4 is preferred to be 0.1 μm or more either in the piezoelectric thin-film element 2 in FIG. 1A or piezoelectric thin-film element 2A in FIG. 1B, and in this case, the first electrode metal film 6 and second electrode metal film 8 can be insulated more securely.

As explained herein, since the peripheral region 4c has a function of isolating the electrodes electrically, and in this specification, it is also called an electrode separation surface, and if there is a step difference with the upper surface of the piezoelectric thin-film, it is called a step portion.

Second Embodiment

Figure 3:
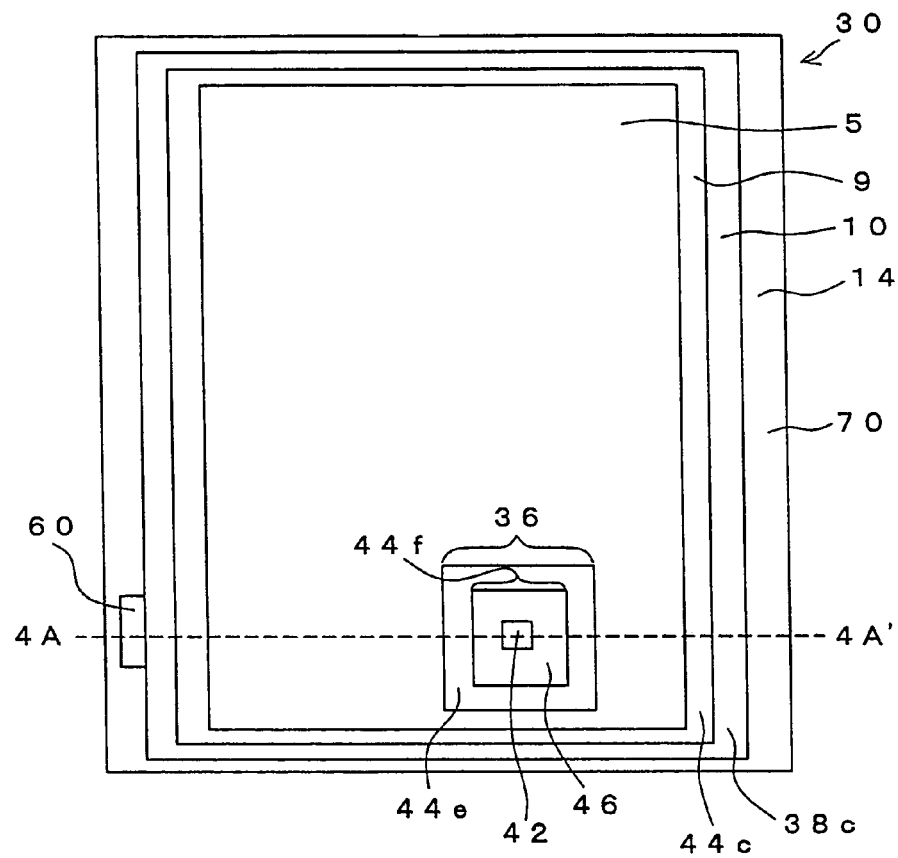
FIG. 3 is a plan view showing a piezoelectric thin-film element in a second embodiment of the invention.
Figure 4:
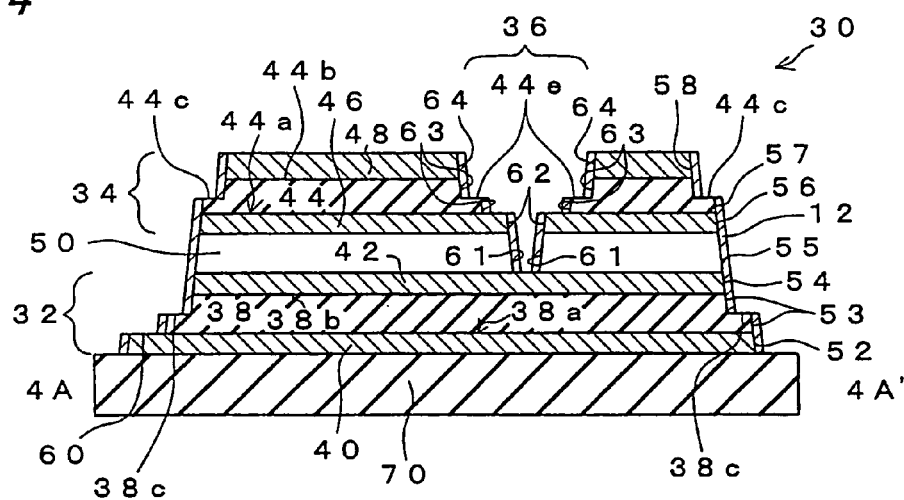
FIG. 4 is a sectional view along line 4A–4A' of the piezoelectric thin-film element in FIG. 3.

A piezoelectric thin-film element of a second embodiment is formed, for example, by laminating two piezoelectric thin-film elements composed of first and second piezoelectric thin-film elements, and as compared with the piezoelectric thin-film element 2 having single layer in the first embodiment, it can be used as an actuator having a greater displacement. FIGS. 3 and 4 are diagrams showing a piezoelectric thin-film element 30 of the second embodiment, and specifically FIG. 3 is a plan view of the piezoelectric thin-film element 30, and FIG. 4 is a sectional view along line 4A–4A' of the piezoelectric thin-film element 30 in FIG. 3. In FIG. 3, since the area is limited, side wall deposits 12 are not shown.

As described later in the manufacturing method of the piezoelectric thin-film element 30, the contour (shape) of the piezoelectric thin-film element 30 and through-hole 36 are formed by dry etching of a laminated body composed of a first unit laminated body having a first piezoelectric thin-film element 32 disposed on a substrate 70, and a second unit laminated body formed on the first laminated body and having a second piezoelectric thin-film element 34.

Figure 5:
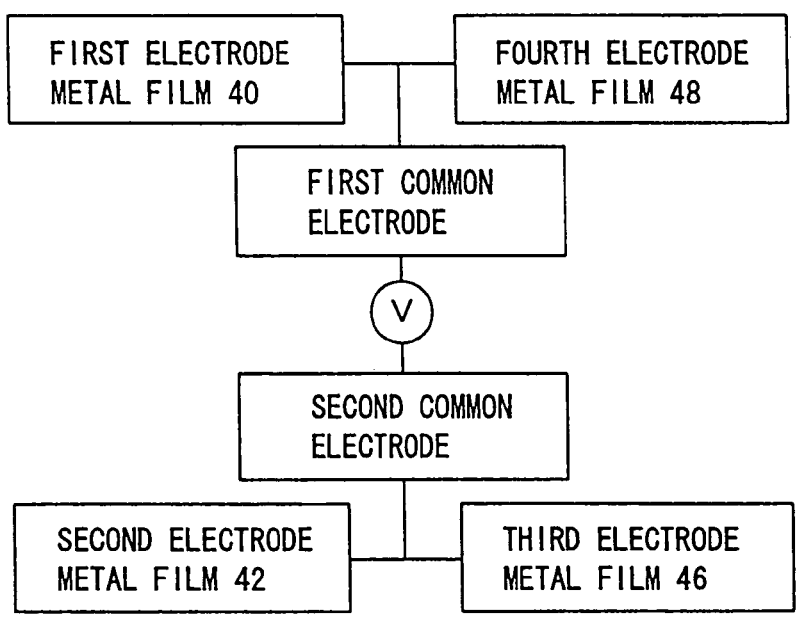
FIG. 5 is a diagram schematically showing an example of a voltage application method of piezoelectric thin-film element in the second embodiment of the invention.

The piezoelectric thin-film element 30 obtained by dry etching is shown in FIG. 4, in which the second piezoelectric thin-film element 34 is adhered and laminated with an adhesive layer 50 on the first piezoelectric thin-film element 32 formed on the principal surface of the substrate 70, and the first piezoelectric thin-film element 32 and second piezoelectric thin-film element 34 can be electrically connected by way of the through-hole 36 so as to be composed as shown in FIG. 5. This process is described later.

The first piezoelectric thin-film element 32 for composing the lower layer of the piezoelectric thin-film element 30 is composed of a first piezoelectric thin-film 38, a first electrode metal film 40 formed on the lower surface 33*a* of the piezoelectric thin-film 38, and a second electrode metal film 42 formed on the top of the piezoelectric thin-film 38 and having a smaller area than the first electrode metal film 40. The top of the first piezoelectric thin-film 38 is composed of a central region 38*c* covered with the second electrode metal film 42, and a peripheral region 38*c* surrounding the central region 38*b* and exposing the first piezoelectric thin-film 38. In the first piezoelectric thin-film 38, a step difference is formed in the peripheral region 38*c* so that the thickness in the peripheral region 38*c* may be smaller than the thickness in the central region 38*b*. Further, a part of the first electrode metal film 40 is drawn out as shown in FIG. 3 for the ease of wiring, and a partial surface 60 is exposed on the substrate 70.

The second piezoelectric thin-film element 34 laminated on the first piezoelectric thin-film element 32 with the adhesive layer 50 is composed of a second piezoelectric thin-film 44, a third electrode metal film 46 formed on the lower surface 44*a* of the piezoelectric thin-film 44, and a fourth electrode metal film 48 formed on the top of the piezoelectric thin-film 44 and having a smaller area than the third electrode metal film 46. The second piezoelectric thin-film 44 has an opening 44*f* forming a part of the through-hole 36, and the top of the second piezoelectric thin-film 44 is composed of a central region 44*b* covered with the fourth electrode metal film 48, a peripheral region 44*c* surrounding the periphery of the central region 44*b* and exposing the second piezoelectric thin-film 44, and an opening peripheral region 44*e* surrounding the opening 44*f* inside the central region 44*b* and exposing the second piezoelectric thin-film 44. In the second piezoelectric thin-film 44, a step difference is formed in the opening peripheral region 44*e* and the peripheral region 44*c* so that the thickness of the opening peripheral region 44*e* and the peripheral region 44*c* may be greater than the thickness of the central region 44*b*.

FIG. 5 is a diagram schematically showing an example of a voltage application method of the piezoelectric thin-film element 30. As shown in FIG. 5, according to the piezoelectric thin-film element 30, a first common electrode is formed by short-circuiting the first electrode metal film 40 and the fourth electrode metal film 48, and a second common electrode is formed by short-circuiting the second electrode metal film 42 and the third electrode metal film 46. By applying a voltage between the thus formed first common electrode and the second common electrode, the first piezoelectric thin-film 38 and second piezoelectric thin-film 44 are allowed to expand and contract within a plane, so that the piezoelectric element 30 can be used as an actuator.

In actual wiring, a desired electrical connection is made by patterning the insulating film and patterning the metal film on the top of the piezoelectric thin-film element in FIGS. 3 and 4. It is also possible to connect by using wire leads.

According to the piezoelectric thin-film element 30, as shown in FIGS. 3 and 4, the through-hole 36 is formed from the fourth electrode metal film 48 to the second electrode metal film 42, and the third electrode metal film 46 and the second electrode metal film 42 are exposed in their top inside the through-hole 36. The entire surface of the fourth electrode metal film 48 is exposed on the top of the piezoelectric thin-film element 30, and the first electrode metal film 40 is exposed in its partial surface 60 as mentioned above. Therefore, necessary wiring may be connected in the exposed portion of each electrode metal film, and a voltage can be applied to each electrode metal film.

In the piezoelectric thin-film element 30 of the embodiment, at the dry etching step, side wall deposits 12 are adhered on a side face 52 of the first electrode metal film 40, a side face 53 of the first piezoelectric thin-film 38, and a side face 54 of the second electrode metal film 42, but side wall deposits 12 are not adhered on the peripheral region 38*c*. Therefore, since the side wall deposits 12 are isolated by the peripheral region 48*c*, the first electrode metal film 40 and the second electrode metal film 42 are not short-circuited through the side wall deposits 12.

Similarly, side wall deposits 12 are adhered on a side face 56 of the third electrode metal film 46, a side wall 57 of the second piezoelectric thin-film 44, and a side wall 58 of the fourth electrode metal film 48, but side wall deposits 12 are not adhered on the peripheral region 44*c*. Further, in the through-hole 36, side wall deposits 12 are adhered on a side face 62 of the third electrode metal film 46, a side face 63 of the second piezoelectric thin-film 44, and a side face 64 of the fourth electrode metal film 48, but side wall deposits 12 are not adhered on the opening peripheral region 44*e*. Therefore, since the side wall deposits 12 are isolated by the peripheral region 44*c* and the opening peripheral region 44*e*, the third electrode metal film 46 and the fourth electrode metal film 48 are not short-circuited through the side wall deposits 12.

The second electrode metal film 42 and the third electrode metal film 46 may be short-circuited through the side wall deposits 12 formed on side faces 55 and 61 of the adhesive layer 50, but as described above by reference to FIG. 5, since the second electrode meal film 42 and the third electrode metal film 46 are at an identical potential, if the second electrode metal film 42 and the third electrode metal film 46 are short-circuited through side wall deposits 12, there is no effect on the piezoelectric element.

As explained herein, according to the piezoelectric thin-film element 30 of the embodiment, the insulation between the first electrode metal film 40 and second electrode metal film 42 can be enhanced, and also the insulation between the third electrode metal film 46 and fourth electrode metal film 48 can be enhanced, and the reliability of the piezoelectric thin-film element can be enhanced.

Referring now to FIGS. 6 to 21, a manufacturing method of the piezoelectric element 30 of the embodiment is explained. FIGS. 6 to 21 are sectional views corresponding to line 4A-4A' of the piezoelectric element 30 shown in FIG. 3.

Figure 6:
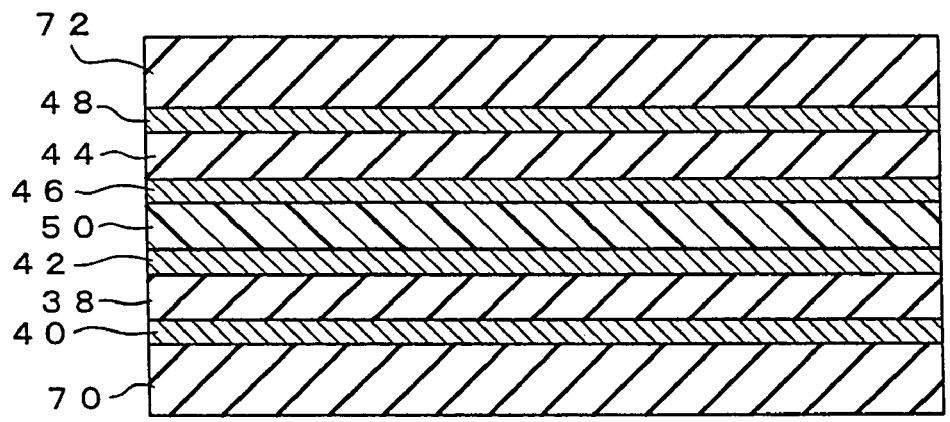
FIG. 6 is a sectional view explaining a manufacturing method of piezoelectric thin-film element in the second embodiment.

First, on a substrate 70, a first electrode metal film 40, a first piezoelectric thin-film 38, and a second electrode metal film 42 are deposited in this sequence from the substrate 70 side. On other substrate 72, a fourth electrode metal film 48, a second piezoelectric thin-film 44, and a third electrode metal film 46 are deposited in this sequence from the substrate 72 side. Next, these two laminated bodies are adhered together, as shown in FIG. 6, with an adhesive layer 50 so that the second electrode metal film 42 and third electrode metal film 46 may face each other. Further, without using adhesive, the second electrode metal film 42 and third electrode metal film 46 may be adhered by thermal fusion using ultrasonic vibration. When a conductive adhesive is used as the adhesive, meanwhile, the second electrode metal film 42 and third electrode metal film 46 may be electrically connected without using through-hole 36 (see FIG. 3, FIG. 4).

Figure 7:
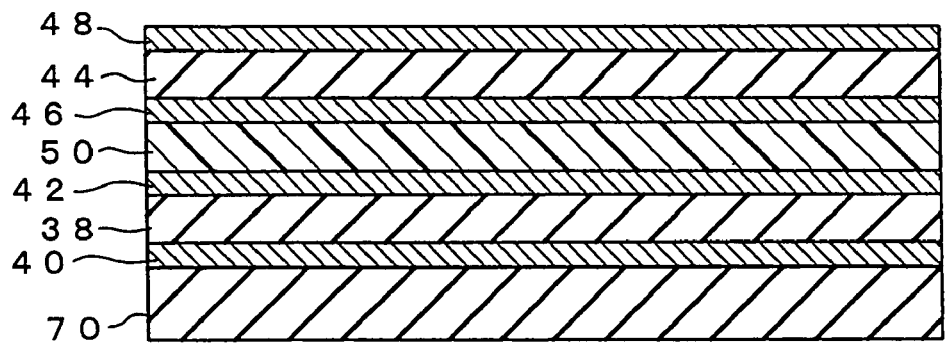
FIG. 7 is a sectional view explaining a manufacturing method of piezoelectric thin-film element in the second embodiment.
Figure 8:
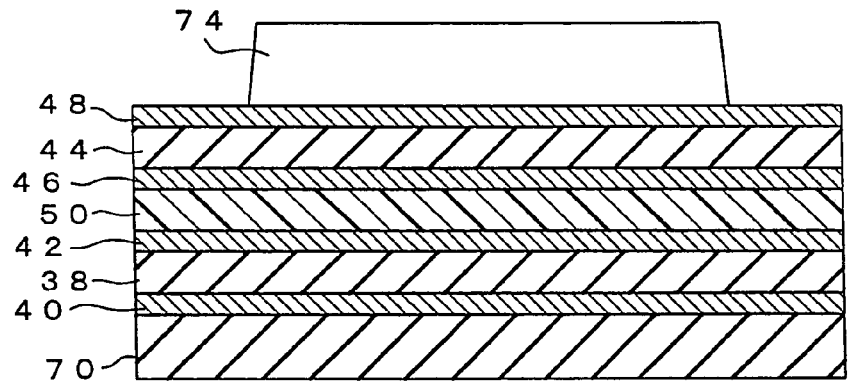
FIG. 8 is a sectional view explaining a manufacturing method of piezoelectric thin-film element in the second embodiment.

Next, as shown in FIG. 7, the substrate 72 is removed, for example, by wet etching, and a first etching mask 74 is formed on the fourth electrode metal film 48 as shown in FIG. 8. The first etching mask 74 may be formed, for example, by photolithography using photoresist. As mentioned below, a second etching mask 76, a third etching mask 78, a fourth etching mask 80, and fifth etching mask 82 are formed similarly.

Figure 9:
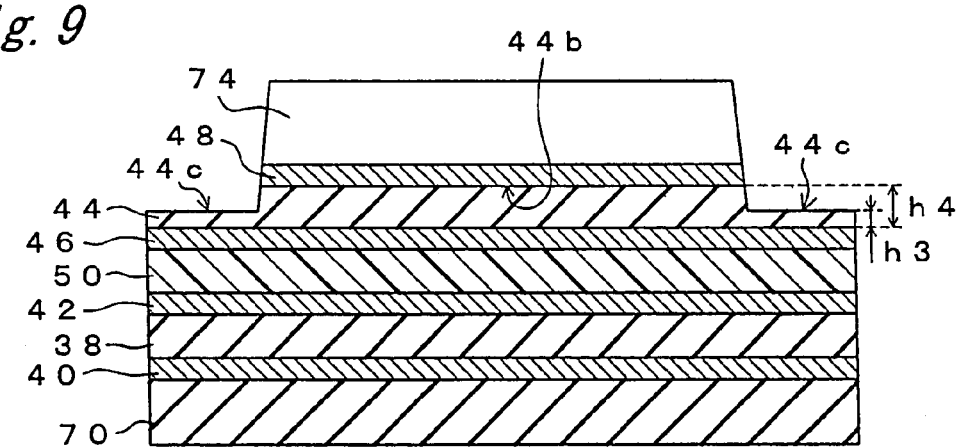
FIG. 9 is a sectional view explaining a manufacturing method of piezoelectric thin-film element in the second embodiment.
Figure 10:
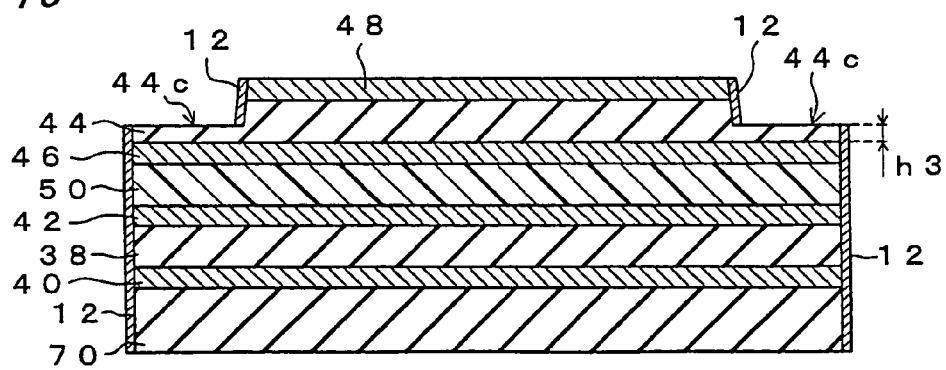
FIG. 10 is a sectional view explaining a manufacturing method of piezoelectric thin-film element in the second embodiment.

As shown in FIG. 9, the fourth electrode metal film 48 in a region not covered with the mask 74 is removed by dry etching, and part of the second piezoelectric thin-film 44 is removed by etching until the thickness of the second piezoelectric thin-film 44 may be h3 (first dry etching step). As a result, a central region 44b covered with the fourth electrode metal film 48, and a peripheral region 44c surrounding the central region 44b and exposing the second piezoelectric thin-film 44 are formed on the top of the second piezoelectric thin-film 44. Further, a step difference is formed in the peripheral region 44c, and the thickness h3 of the second piezoelectric thin-film 44 in the peripheral region 44c is smaller than the thickness h4 of the piezoelectric thin-film 44 in the central region 44b.

After the first dry etching step, the first etching mask 74 is immersed in a proper organic solvent, and the first etching mask 74 is removed by ultrasonic radiation, ultrasonic vibration or the like as required. As mentioned below, a second etching mask 76, a third etching mask 78, a fourth etching mask 80, and fifth etching mask 82 are removed similarly.

In the first dry etching step, etching by-products are formed as mentioned above, and, as shown in FIG. 10, side wall deposits 12 are formed in a thin film at the side face of the laminated body. That is, side wall deposits 12 are adhered on the side face of the fourth electrode metal film 48, side face of the second piezoelectric thin-film 44, side face of the third electrode metal film 46, side face of the adhesive layer 50, side face of the second electrode metal film 42, side face of the first piezoelectric thin-film 38, and side face of the first electrode metal film 40. The peripheral region 44c of the second piezoelectric thin-film 44 is a plane substantially vertical to the advancing direction of etching, and it is the impinging plane of the ion particles generated from the etching gas, and hence side wall deposits 12 are not adhered.

Figure 11:
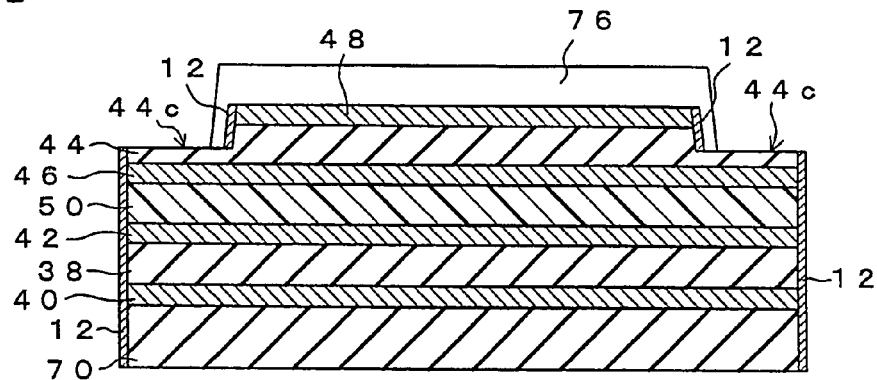
FIG. 11 is a sectional view explaining a manufacturing method of piezoelectric thin-film element in the second embodiment.

A second etching mask 76 is formed as shown in FIG. 11 on the fourth electrode metal film 48 not removed by the first dry etching step. This second etching mask 76 is wider than the area of the first etching mask 74 shown in FIG. 8, and hence the second etching mask 78 covers part of the peripheral region 44c of the second piezoelectric thin-film 44, in addition to the fourth electrode metal film 48.

Figure 12:
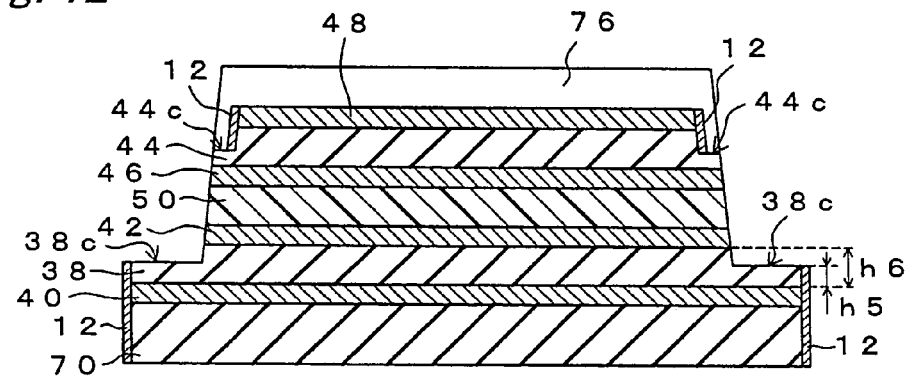
FIG. 12 is a sectional view explaining a manufacturing method of piezoelectric thin-film element in the second embodiment.
Figure 13:
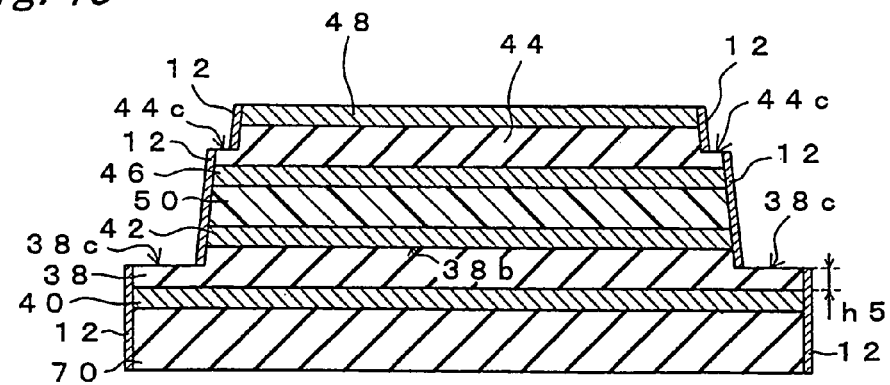
FIG. 13 is a sectional view explaining a manufacturing method of piezoelectric thin-film element in the second embodiment.

Then dry etching is carried out, and in the region not covered with the second etching mask 76 is removed as shown in FIG. 12, etching is carried out until the thickness of the first piezoelectric thin-film 38 becomes h5 (second dry etching step). After dry etching, the second etching mask is removed as shown in FIG. 13. By this second dry etching step, a central region 38b covered with the second electrode metal film 42, and a peripheral region 38c surrounding the central region 38b and exposing the first piezoelectric thin-film 38 are formed on the top face of the first piezoelectric thin-film 38. Further, a step difference is formed in the peripheral region 38c, and the thickness (h5) of the first piezoelectric thin-film 38 in the peripheral region 38c is smaller than the thickness (h6) of the piezoelectric thin-film 38 in the central region 38b.

After the second dry etching step, too, etching by-products are formed, and side wall deposits 12 in a thin film are adhered on the side face of the newly formed laminated body, that is, the side face of the second piezoelectric thin-film 44, side face of the third electrode metal film 46, side face of the adhesive layer 50, side face of the second electrode metal film 42, side face of the first piezoelectric thin-film 38, and side face of the first electrode metal film 40. The peripheral region 38c of the first piezoelectric thin-film 38 is a plane substantially vertical to the advancing direction of etching, and it is the impinging plane of the ion particles generated from the etching gas, and hence side wall deposits 12 are not adhered.

Figure 14:
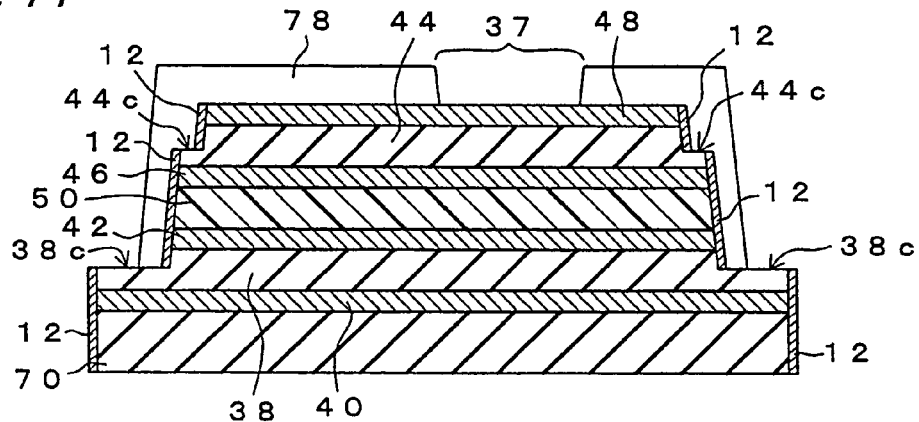
FIG. 14 is a sectional view explaining a manufacturing method of piezoelectric thin-film element in the second embodiment.

A third etching mask 78 is formed on the fourth electrode metal film 48 as shown in FIG. 14. This third etching mask 78 is wider than the area of the second etching mask 76 shown in FIG. 11, and covers part of the peripheral region 38c of the first piezoelectric thin-film 38, in addition to the fourth electrode metal film 48 and peripheral region 44c of the second piezoelectric thin-film 44. The third etching mask 78 also has an opening 37 for forming a through-hole 36 in the element.

Figure 15:
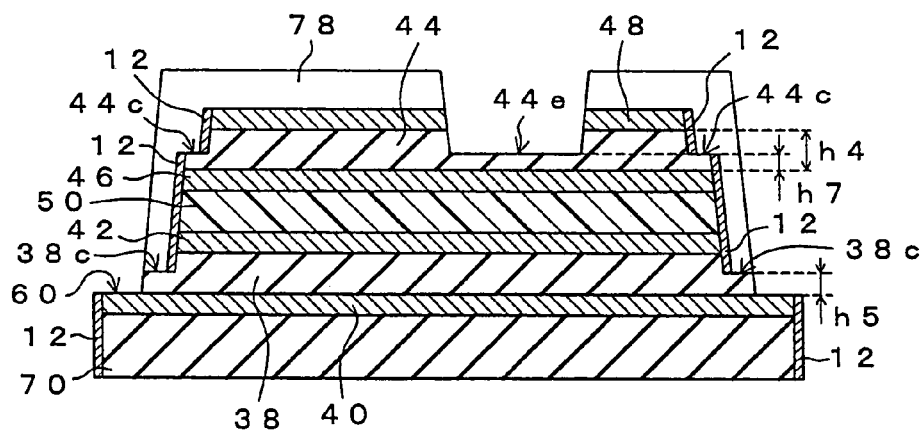
FIG. 15 is a sectional view explaining a manufacturing method of piezoelectric thin-film element in the second embodiment.
Figure 16:
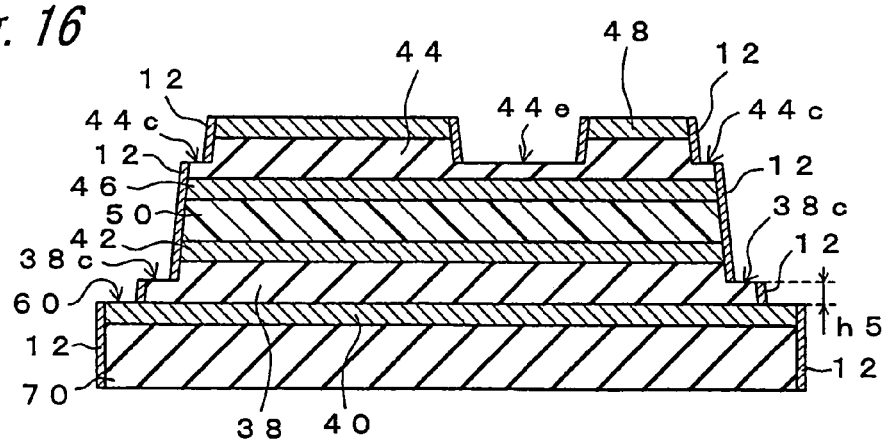
FIG. 16 is a sectional view explaining a manufacturing method of piezoelectric thin-film element in the second embodiment.

A third dry etching step is executed as shown in FIG. 15. In the third dry etching shown in FIG. 15, in the contour of the element, the first piezoelectric thin-film 38 of thickness h5 in the region not covered with the third etching mask 78 is removed. At the same time, in the opening 37 of the third etching mask 78, the fourth electrode metal film 48 is removed, and part of the second piezoelectric thin-film 44 is removed by etching until the thickness of the second piezoelectric thin-film 44 becomes h7 (third dry etching step). After the etching, the third etching mask 78 is removed as shown in FIG. 16.

By the third dry etching step, the second piezoelectric thin-film 44 is exposed in the opening 37 (face 44e of the second piezoelectric thin-film 44). Further, in the contour of the element, a surface 60 of the first electrode metal film 40 is exposed. By this third etching step, too, etching by-products are generated and side wall deposits 12 in a thin film are adhered on the side face of the newly formed laminated body, that is, the side face of the first piezoelectric thin-film 38 of thickness h5, side face of the fourth electrode metal film 48 in the opening 37, and side face of the second piezoelectric thin-film 44. Owing to the same reason explained above, wall deposits are not formed in the opening peripheral region 44e of the second piezoelectric thin-film 44 and the surface of the first electrode metal film 40.

Figure 17:
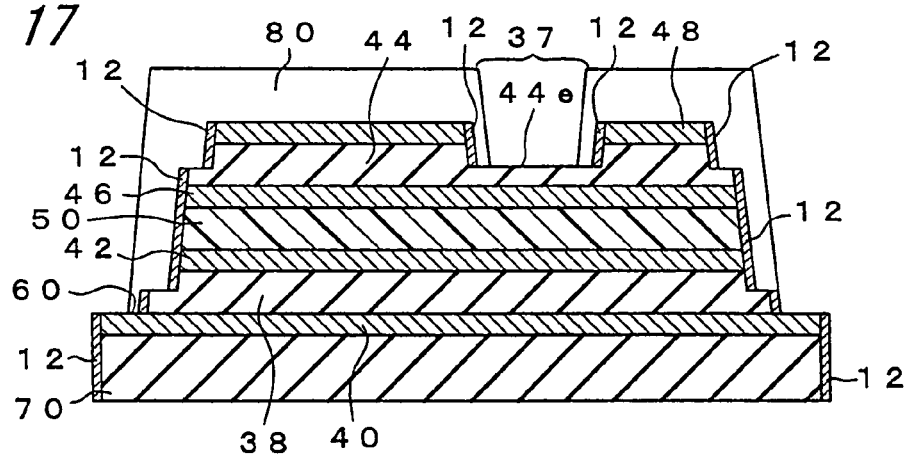
FIG. 17 is a sectional view explaining a manufacturing method of piezoelectric thin-film element in the second embodiment.

A fourth etching mask 80 is formed on the fourth electrode metal film 48 as shown in FIG. 17. This fourth etching mask 80 is smaller in area of the opening 37 and larger in the mask surface area as compared with the third etching mask 78 in FIG. 14, and covers part of the exposed surface 60 of the first electrode metal film 40 and part of the surface 44e of the second piezoelectric thin-film 44.

Figure 18:
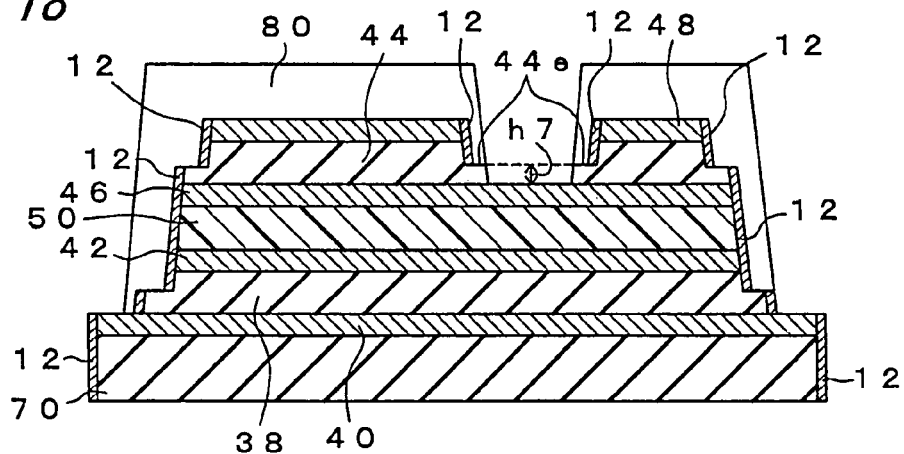
FIG. 18 is a sectional view explaining a manufacturing method of piezoelectric thin-film element in the second embodiment.
Figure 19:
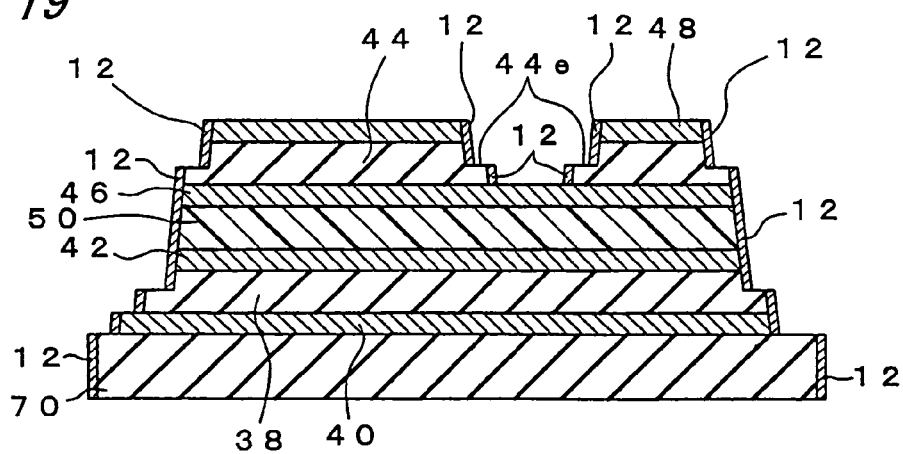
FIG. 19 is a sectional view explaining a manufacturing method of piezoelectric thin-film element in the second embodiment.

The fourth dry etching is executed as shown in FIG. 18. In the fourth dry etching shown in FIG. 18, in the contour of the element, the first electrode metal film 40 is removed by etching. At the same time, in the opening 37, the second piezoelectric thin-film 44 of thickness h7 is removed, the third electrode metal film 46 is exposed. After etching, the fourth etching mask 80 is removed as shown in FIG. 19.

In the fourth dry etching step, too, etching by-products are formed, and side wall deposits 12 in a thin film are adhered on the side face of the newly created laminated body, that is, the side face of the first electrode metal film 40, and side face of the second piezoelectric thin-film 44 in the opening 37.

Figure 20:
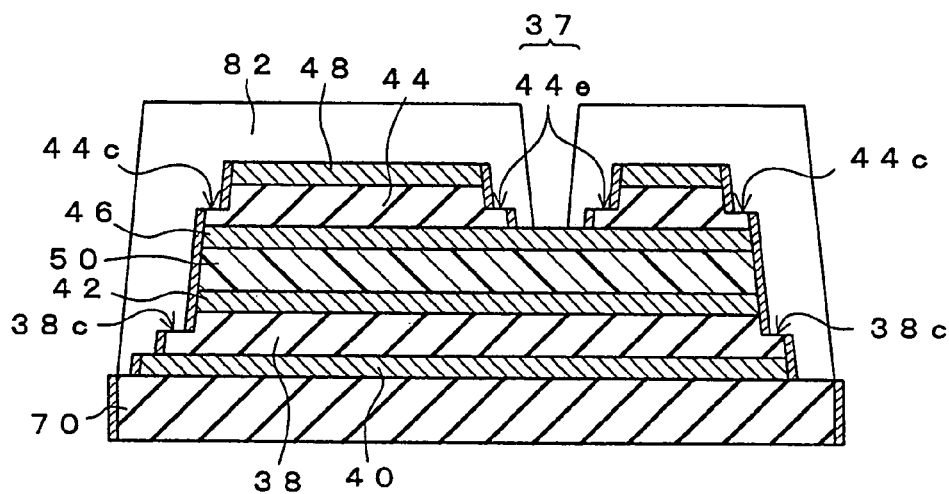
FIG. 20 is a sectional view explaining a manufacturing method of piezoelectric thin-film element in the second embodiment.
Figure 21:
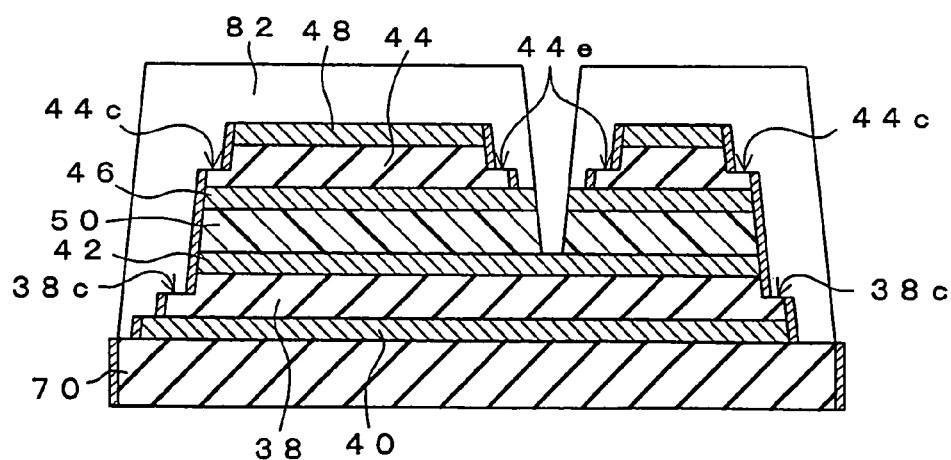
FIG. 21 is a sectional view explaining a manufacturing method of piezoelectric thin-film element in the second embodiment.

A fifth etching mask 82 is formed as shown in FIG. 20, which is smaller in the area of the opening 37 and larger in the mask surface area as compared with the fourth etching mask 80. As shown in FIG. 21, after dry etching until the second electrode metal film 40 is exposed in the opening 37 (fifth dry etching step), the fifth etching mask 82 is removed, and a piezoelectric thin-film element 30 as shown in FIG. 4 is obtained. In addition, in the piezoelectric thin-film element 30 in FIG. 4, side wall deposits adhered on the side face of the substrate 70 are not shown.

When the piezoelectric thin-film element is fabricated by such a method, since the peripheral region 38c which is an electrode separation surface free from side wall deposits can be formed on the top of the first piezoelectric thin-film 38, the first electrode metal film 40 and the second electrode metal film 42 are not short-circuited through the side wall deposits 12, and the insulation between the first electrode metal film 40 and the second electrode metal film 42 can be enhanced. Moreover, the peripheral region 44c and the opening peripheral region 44e free from side wall deposits can be formed on the top of the second piezoelectric thin-film 44, the third electrode metal film 46 and the fourth electrode metal film 48 are not short-circuited through the side wall deposits 12, and the insulation between the third electrode metal film 46 and fourth electrode metal film 48 can be enhanced. As a result, the reliability of the piezoelectric thin-film element can be enhanced, and the product yield is improved in the manufacturing process.

In FIGS. 3 and 4, the piezoelectric thin-film element 30 is shown to be present on the substrate 70, but it can be also used by removing the substrate 70 in a later step. The substrate may be removed by wet etching, dry etching, polishing, etc.

Figure 22:
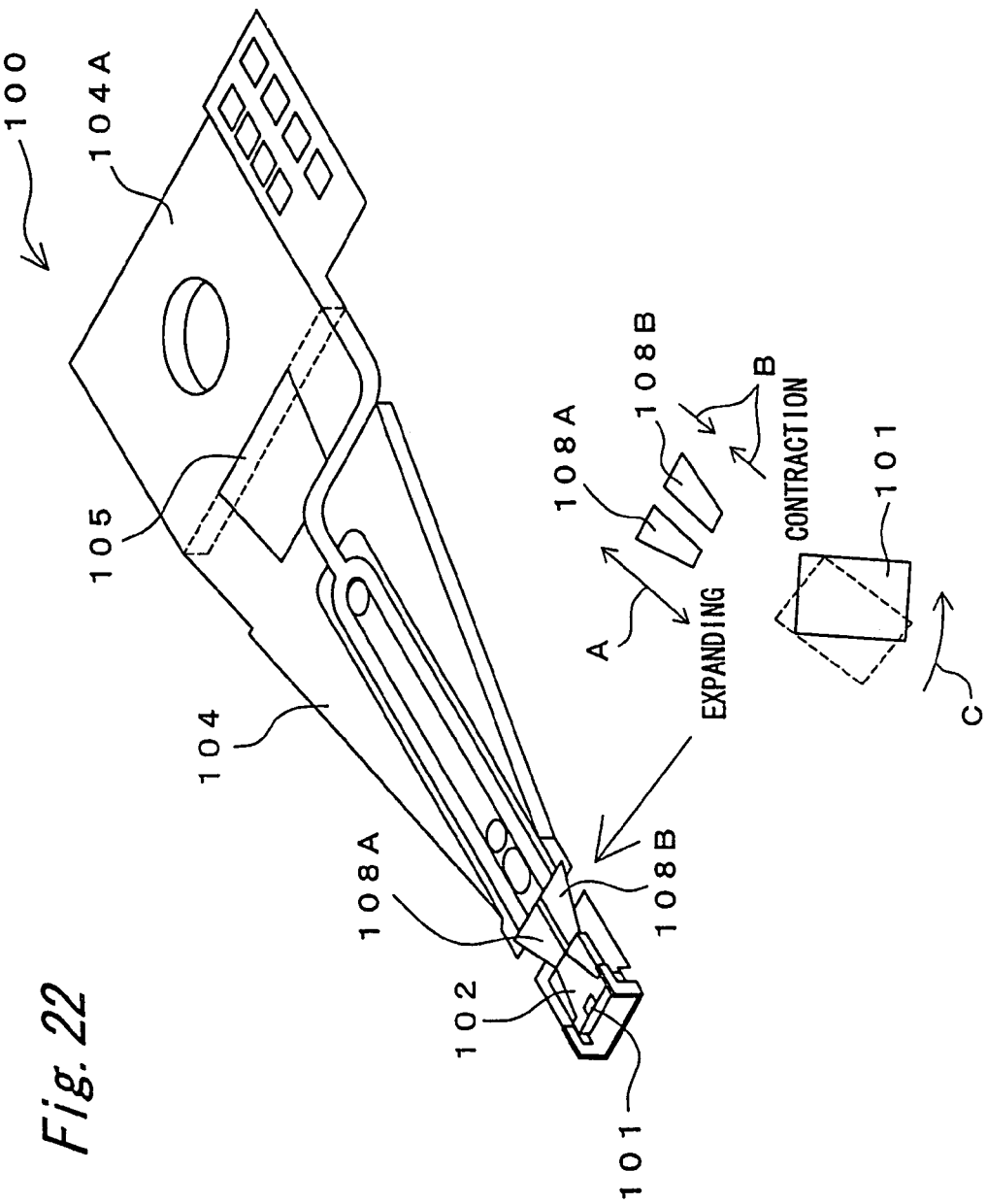
FIG. 22 is a diagram showing a head support mechanism using the piezoelectric thin-film element in the second embodiment.
Figure 23A:
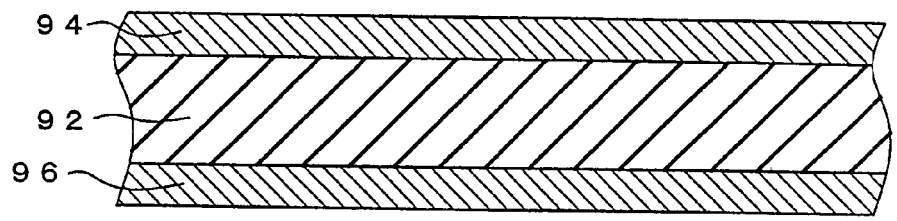
FIG. 23A to FIG. 23C are sectional views showing a manufacturing process of a general piezoelectric thin-film element.
Figure 23B:
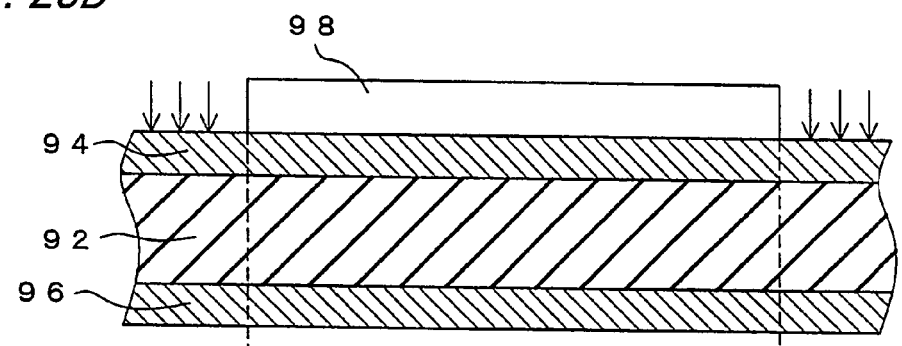
Figure 23C:
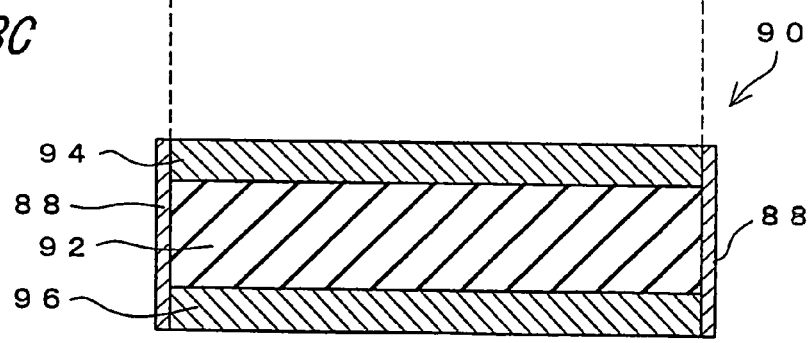

The piezoelectric thin-film element 30 of this embodiment fabricated in such manner can be used, for example, in a head support mechanism 100 as shown in FIG. 22. The head support mechanism 100 is provided in a magnetic disk device, and supports a magnetic head 101 mounted on a slider 102 as shown in FIG. 22. The head support mechanism 100 comprises a load beam 104 connected to the slider 102 by way of actuators 108A and 108B, a base plate 105 connected to the load beam 104, and a base end 140A. The piezoelectric thin-film element 30 of the embodiment can be used in these actuators 108A and 108B.

For example, by displacing the actuator 108A in the direction of arrow A and the actuator 108B in the direction of arrow B as shown in FIG. 22, the head 101 can be displaced in the direction of arrow C. By controlling the displacement of the actuators 108A and 108B, the head 101 mounted on the slider 102 can be positioned at an arbitrary position on the magnetic disk at a very high precision.

Third Embodiment

Figure 24:
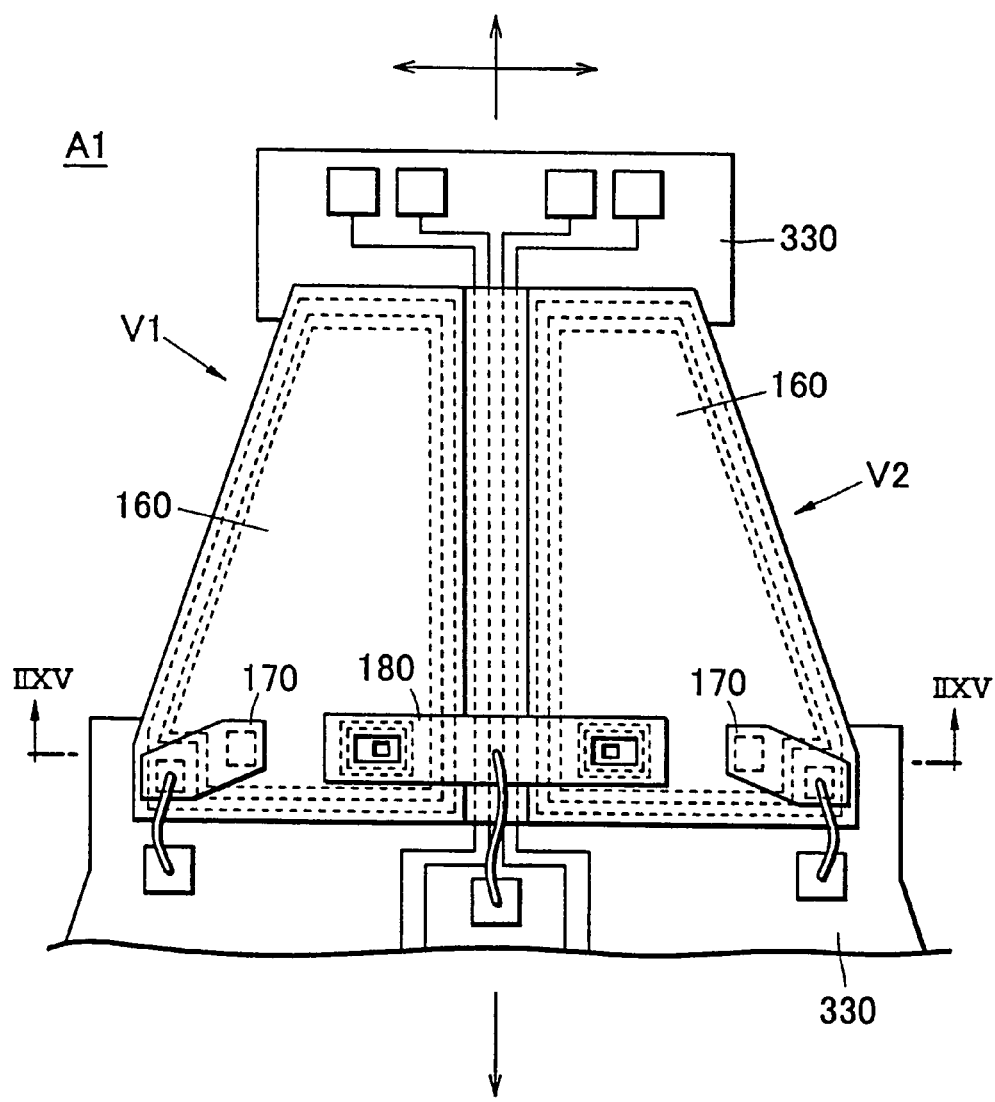
FIG. 24 is a plan view showing an actuator A1 in a third embodiment of the invention.
Figure 25:
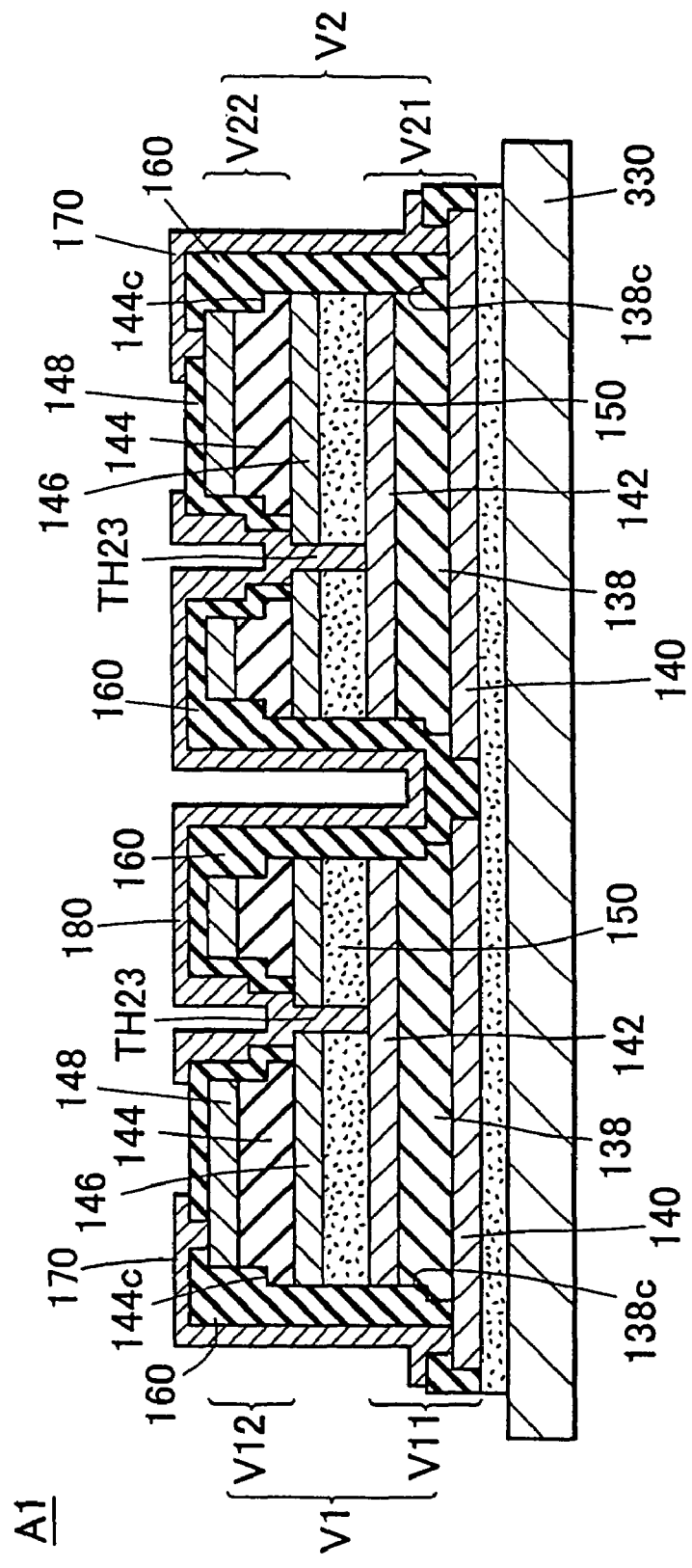
FIG. 25 is a sectional view of line X—X of the actuator A1 in FIG. 24.

FIG. 24 is a plan view of an actuator A1 in a third embodiment of the invention, and FIG. 25 is a sectional view along line X—X in FIG. 24. The actuator A1 of the third embodiment comprises a pair of piezoelectric elements V1, V2 fabricated in the method explained in the first and second embodiments, and is used in a magnetic disk recording and reproducing apparatus for positioning the head slider at a specified track position on the disk at high precision. In the actuator A1 of the third embodiment, the two piezoelectric elements V1, V2 have an identical structure, and disposed by right and left symmetrical positions. These piezoelectric elements V1, V2 are formed each by laminating two piezoelectric thin-film elements V11 (V21), V12 (V22) so as to obtain a greater displacement.

Herein, each piezoelectric thin-film element V11 (V21) has a first piezoelectric thin-film 138 disposed between a first electrode metal film 140 and a second electrode metal film 142, and a step portion 138c is formed as an electrode separation surface on the outer circumference of the first piezoelectric thin-film 138.

Similarly, the piezoelectric thin-film element V12 (V22) has a second piezoelectric thin-film 144 disposed between a third electrode metal film 146 and a fourth electrode metal film 148, and a step portion 144c is formed as an electrode separation surface on the outer circumference of the second piezoelectric thin-film 144.

The piezoelectric thin-film element V11 (V21) and piezoelectric thin-film element V12 (V22) are bonded together through an adhesive layer 150 so that the second electrode metal film 142 and third electrode metal film 146 may face each other. The piezoelectric thin-film element V11 (V21) and piezoelectric thin-film element V12 (V22) are connected with each other so that the second electrode metal film 142 and third electrode metal film 146 may conduct electrically with each other, and also the first electrode metal film 146 and fourth electrode metal film 148 are connected to conduct electrically with each other.

Referring now to the drawings, a manufacturing method of the actuator A1 of the third embodiment is explained below.

In this manufacturing method, first, a unit laminated body for composing the piezoelectric thin-film elements V11, V21 and a unit laminated body for composing the piezoelectric thin-film elements V12, V22 are formed on individual substrates.

Figure 26:
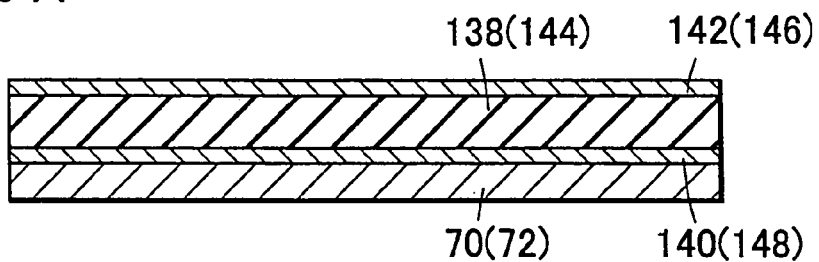
FIG. 26 is a sectional view showing a process for composing a laminated body on a substrate in a manufacturing method of the third embodiment.
Figure 26:
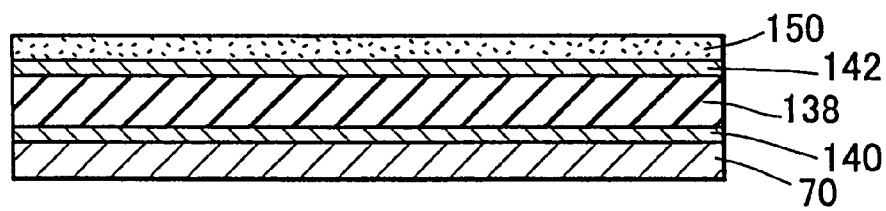
Figure 26:
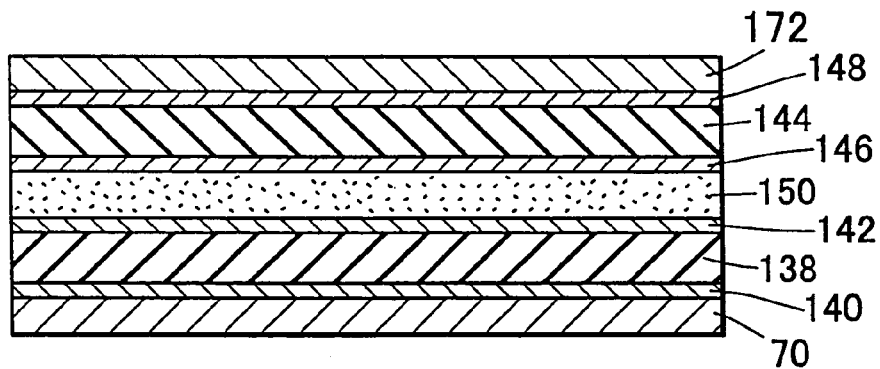
Figure 26:
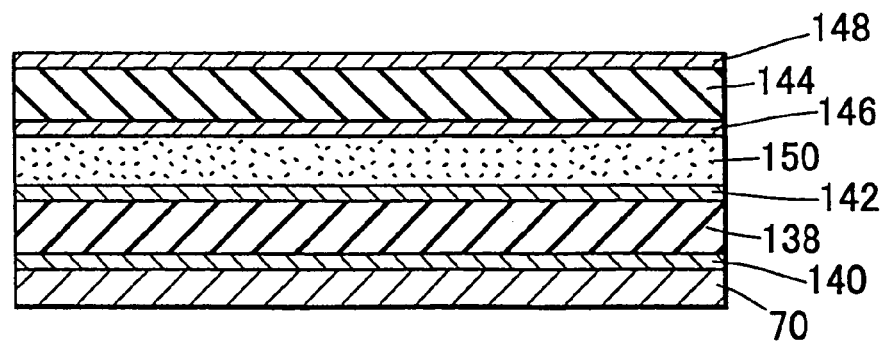

More specifically, as shown in FIG. 26A, on a substrate 70 of monocrystalline magnesium oxide of 0.5 mm in thickness, for example, a first electrode metal film 140 of Pt is formed, and a first piezoelectric thin-film 138 of PZT is formed thereon, and further a second electrode metal film 142 of Pt is formed thereon.

Similarly, on a substrate 72 of monocrystalline magnesium oxide, a unit laminated body composed of a fourth electrode metal film 148, a second piezoelectric thin-film 144, and a third electrode metal film 146 is formed. In FIG. 26A, the reference numerals of the substrate 72, the fourth electrode metal film 148, the second piezoelectric thin-film 144, and the third electrode metal film 146 are shown in parentheses.

Consequently, on the second electrode metal film 142 formed in the highest layer of the substrate 70, an adhesive layer 150 is formed in a thickness of, for example, 1.5 μm (FIG. 26B).

On the adhesive layer 150, the third electrode metal film 146 on the substrate 72 is adhered oppositely, and the unit laminated body on one substrate 70 and the unit laminated body on the other substrate 172 are adhered together (FIG. 26C).

After adhesion, one substrate 72 is removed by etching (FIG. 26D). In this manner, a laminated structure of the first electrode metal film 140, the first piezoelectric thin-film 138, the second electrode metal film 142, the adhesive layer 150, the third electrode metal film 146, the second piezoelectric thin-film 144, and the fourth electrode metal film 148 is formed on the substrate 70.

By processing the laminated structure formed on the substrate 70 as specified below, plural actuators A1 arrayed in a matrix are formed.

Figure 27:
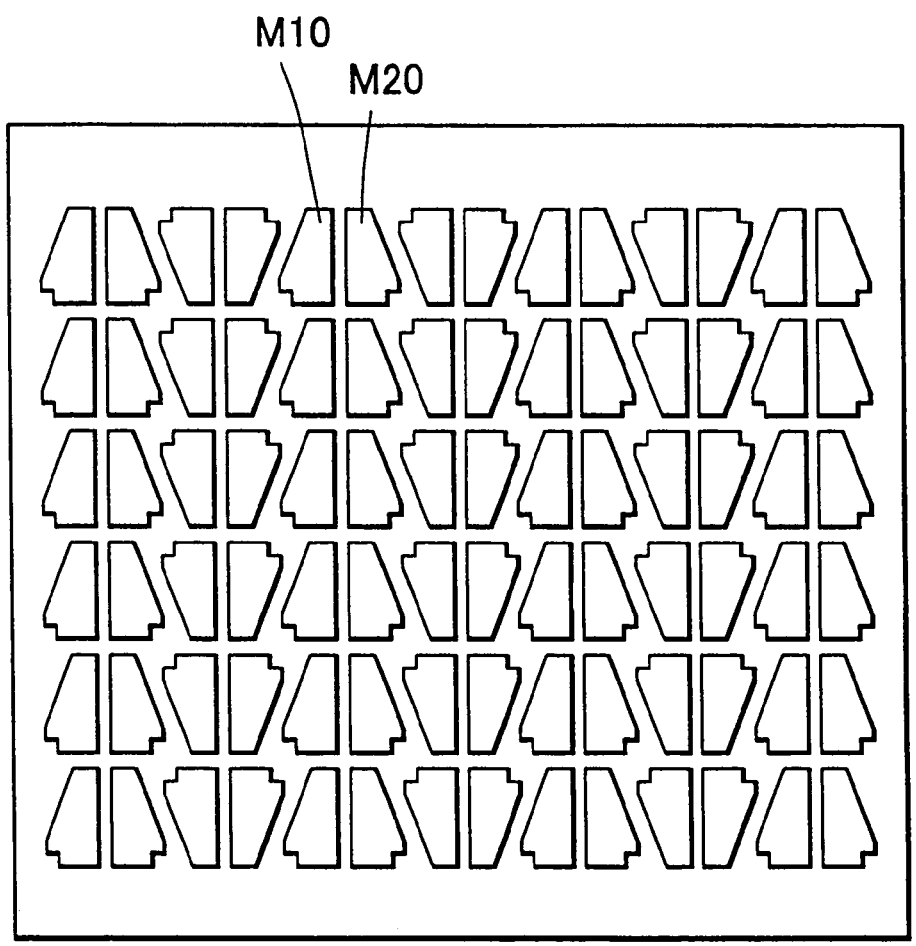
FIG. 27 is a plan view of a process of forming a mask on a substrate in a manufacturing method of the third embodiment.

First, for one actuator A1, a pair of masks M10, M20 are formed on the laminated structure (FIG. 27). Herein, the mask M10 is a mask for forming the piezoelectric element V1, and the mask M20 is a mask for forming the piezoelectric element V2.

Figure 28:
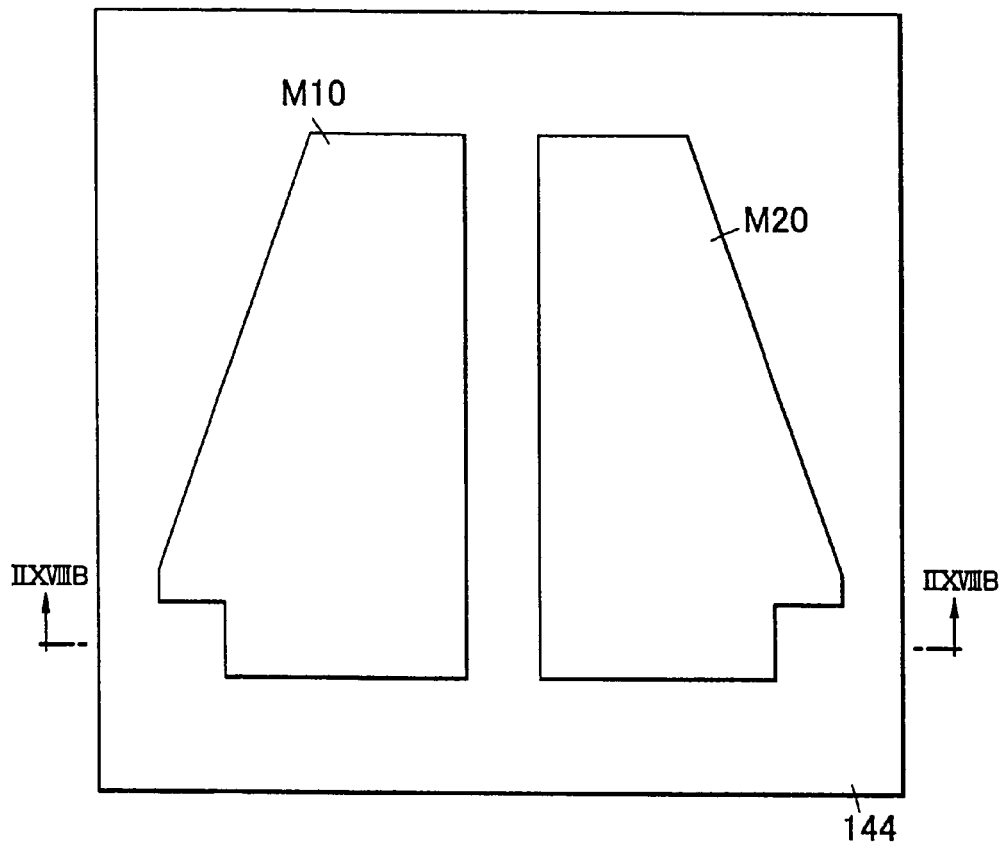
FIG. 28A is a plan view for explaining a process of forming a portion above a second step portion 144c of piezoelectric elements V1, V2 in a manufacturing method of the third embodiment.
FIG. 28B is a sectional view B for explaining a process of forming a portion above a second step portion 144c of piezoelectric elements V1, V2 in a manufacturing method of the third embodiment.
Figure 28:
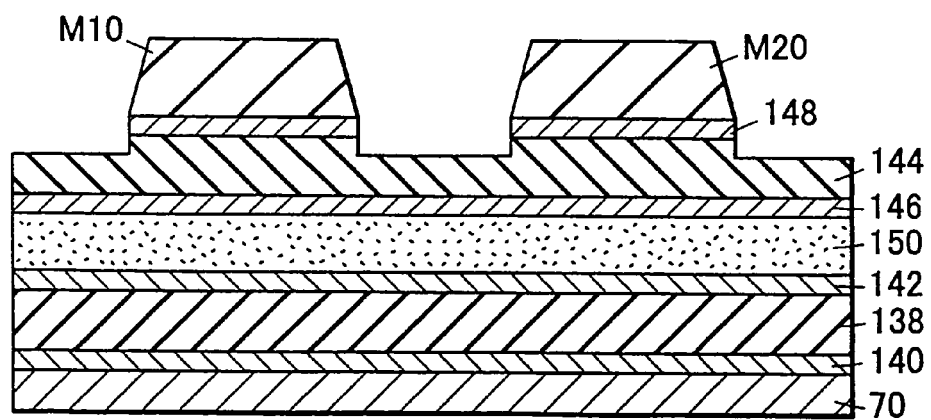
Figure 29:
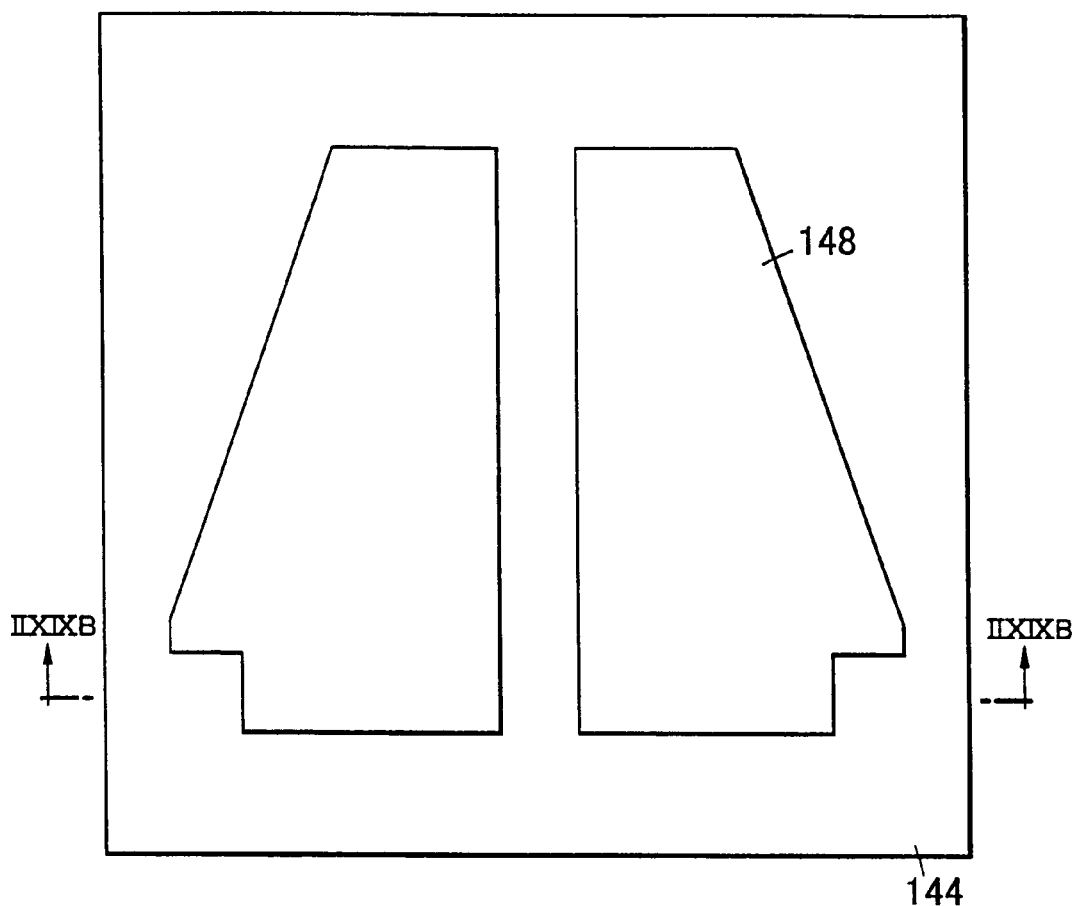
FIG. 29A is a plan view showing a state of peeling masks M10, M20 after forming a portion above a second step portion 144c of piezoelectric elements V1, V2 in a manufacturing method of the third embodiment.
FIG. 29B is a sectional view showing a state of peeling masks M10, M20 after forming a portion above a second step portion 144c of piezoelectric elements V1, V2 in a manufacturing method of the third embodiment.
Figure 29:
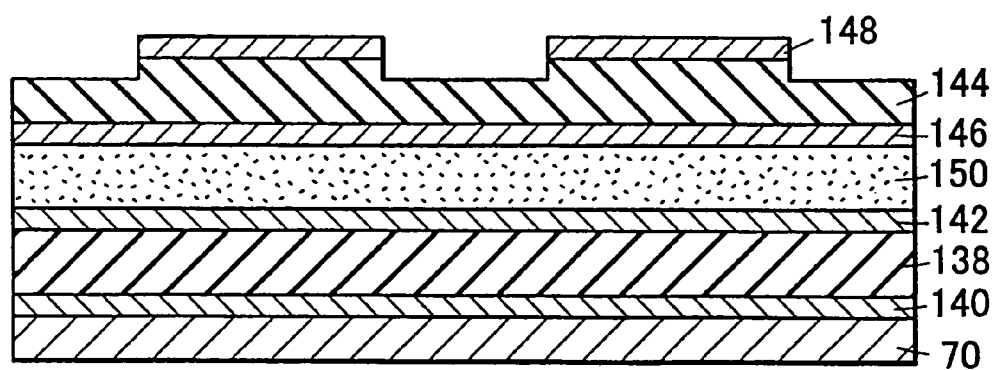
Figure 30:
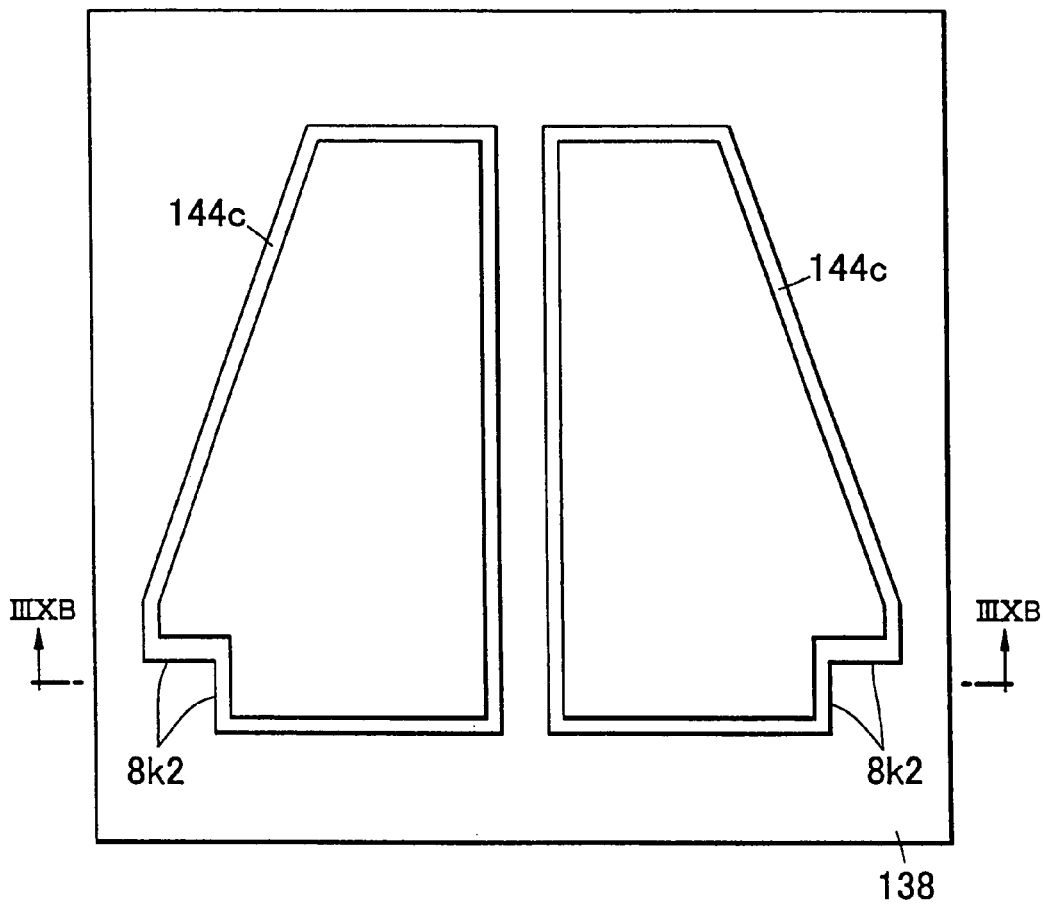
FIG. 30A is a plan view for explaining a process of forming a portion above a first step portion 138c of piezoelectric elements V1, V2 in a manufacturing method of the third embodiment.
FIG. 30B is a sectional view for explaining a process of forming a portion above a first step portion 138c of piezoelectric elements V1, V2 in a manufacturing method of the third embodiment.
Figure 30:
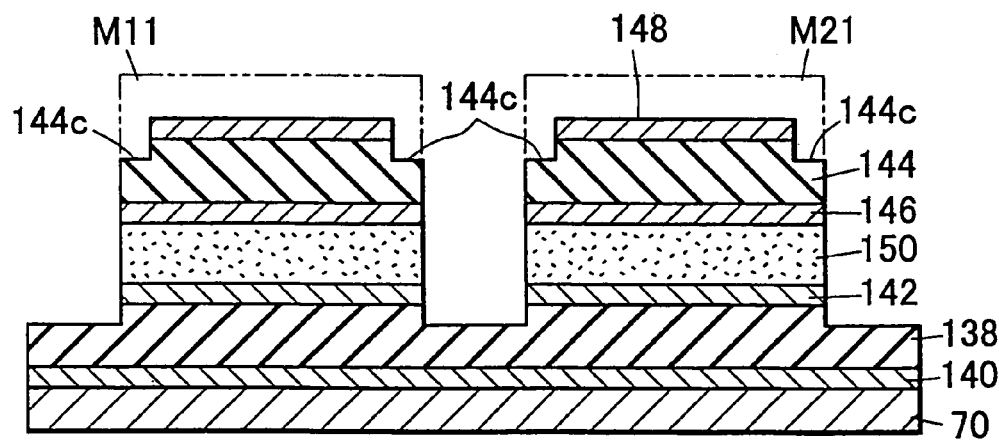
Figure 31:
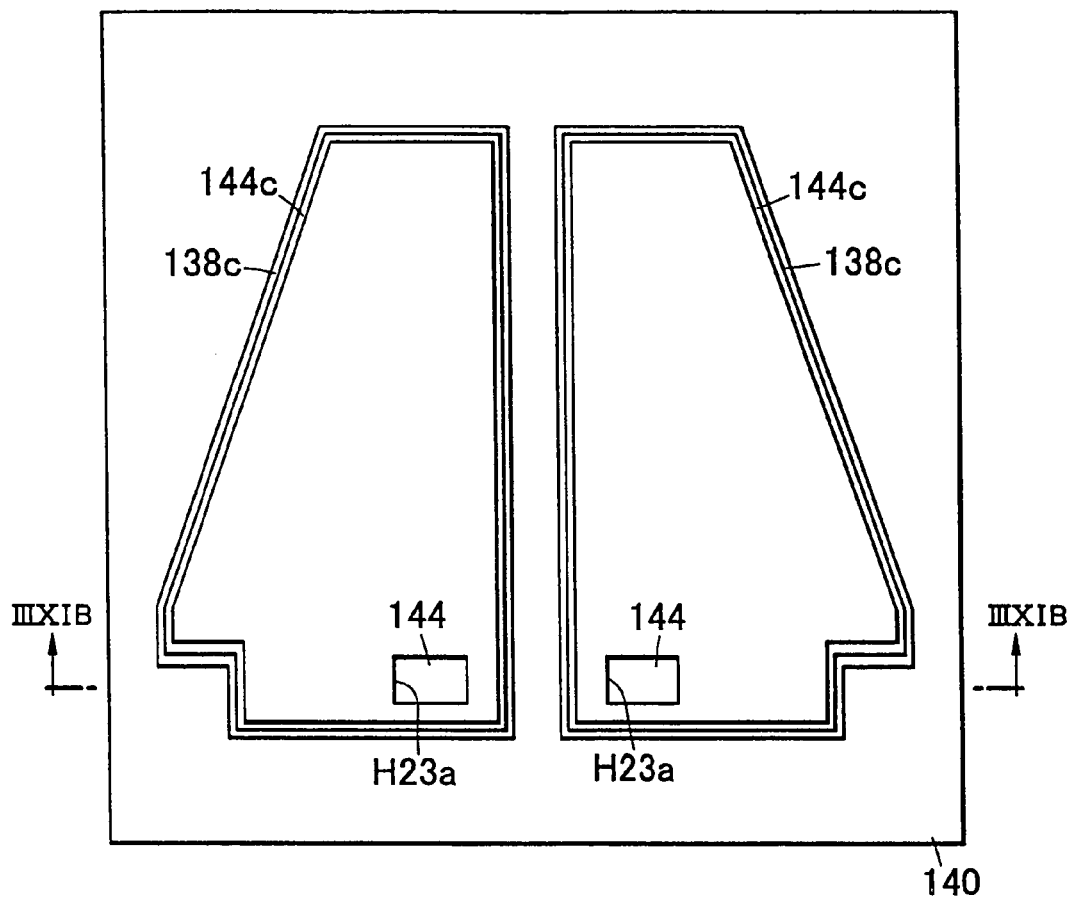
FIG. 31A is a plan view showing a completed state of processing of a first piezoelectric thin-film of piezoelectric elements V1, V2 in a manufacturing method of the third embodiment.
FIG. 31B is a sectional view showing a completed state of processing of the first piezoelectric thin-film of piezoelectric elements V1, V2 in a manufacturing method of the third embodiment.
Figure 31:
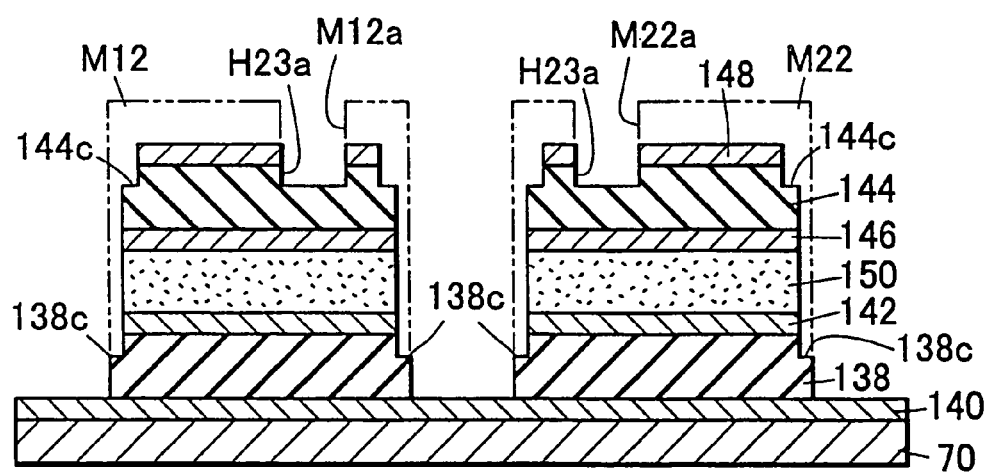
Figure 32:
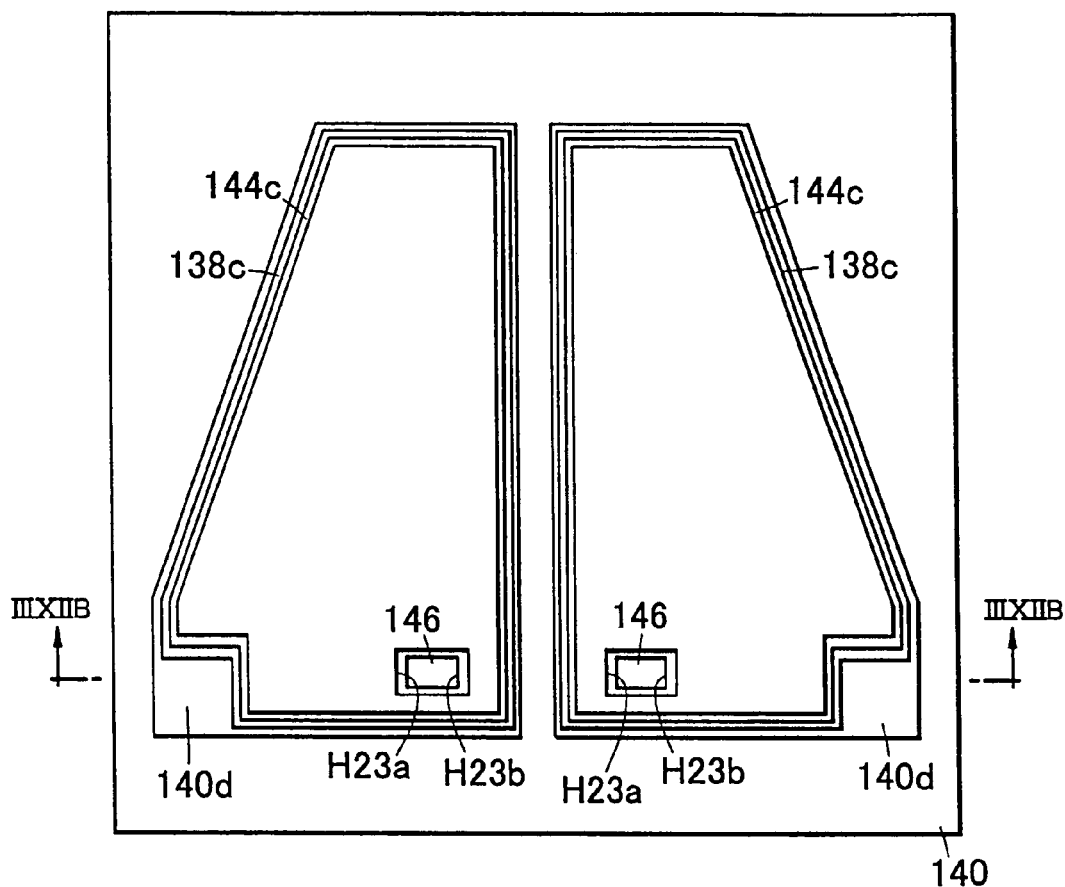
FIG. 32A is a plan view showing a completed state of processing of a first electrode metal film of piezoelectric elements V1, V2 in a manufacturing method of the third embodiment.
FIG. 32B is a sectional view showing a completed state of processing of the first electrode metal film of piezoelectric elements V1, V2 in a manufacturing method of the third embodiment.
Figure 32:
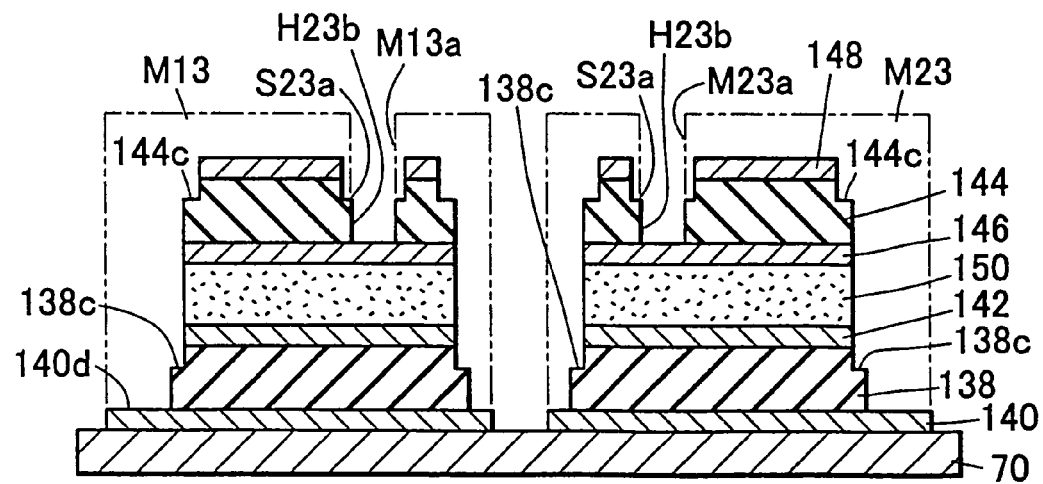
Figure 33:
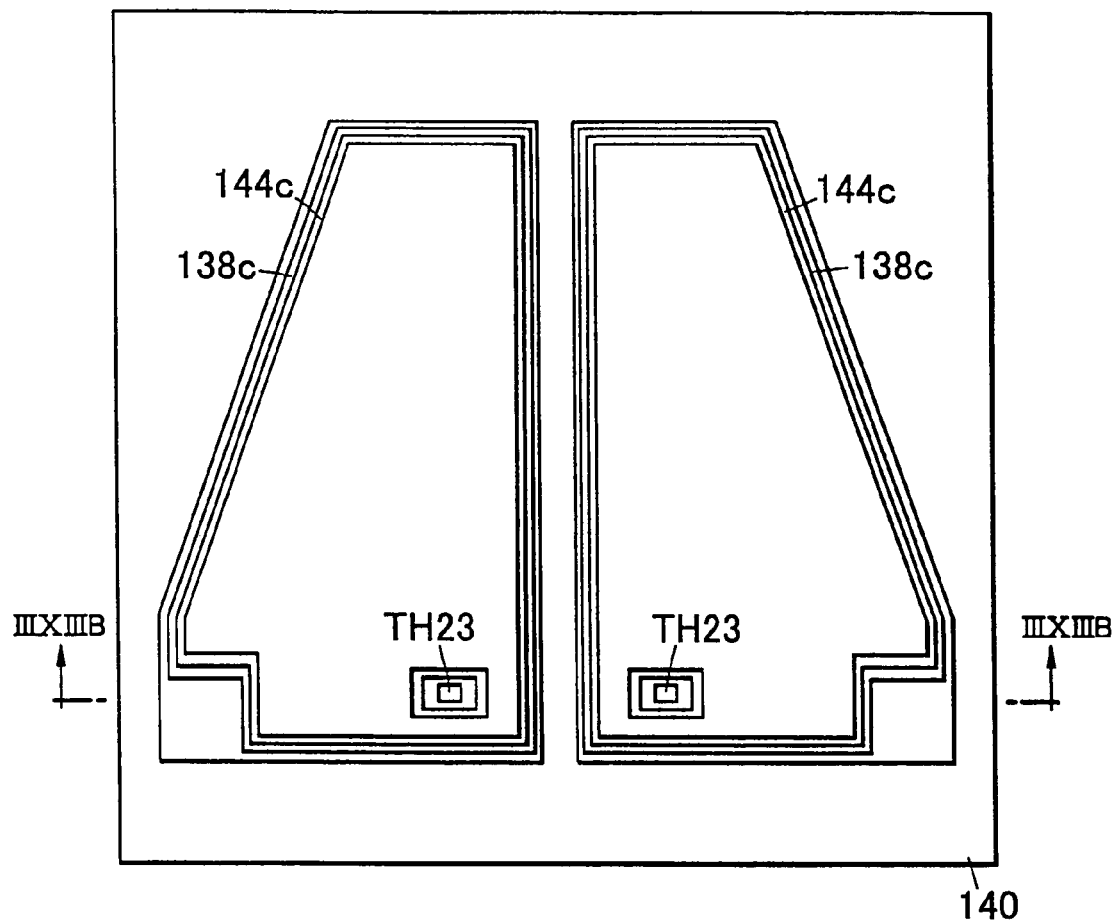
FIG. 33A is a plan view showing a process of forming a through-hole TH23 penetrating through an adhesive layer 150 in a manufacturing method of the third embodiment.
FIG. 33B is a sectional view showing a process of forming a through-hole TH23 penetrating through an adhesive layer 150 in a manufacturing method of the third embodiment.
Figure 33:
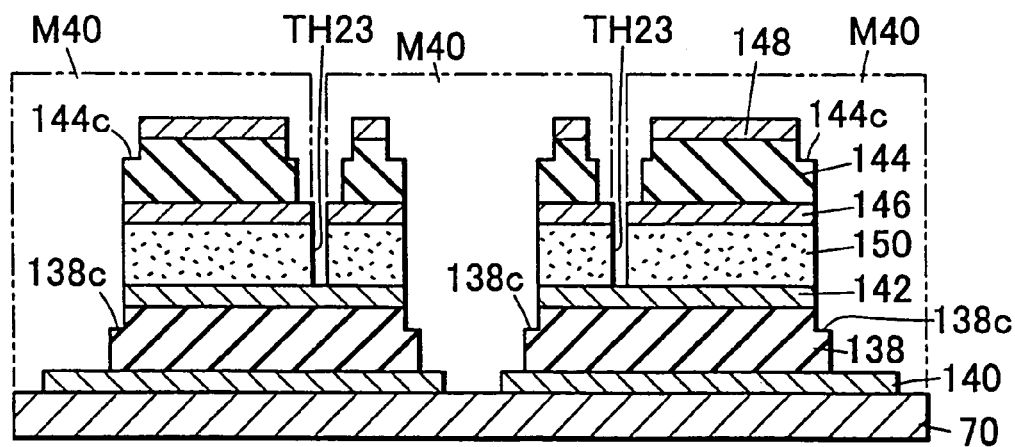
Figure 34:
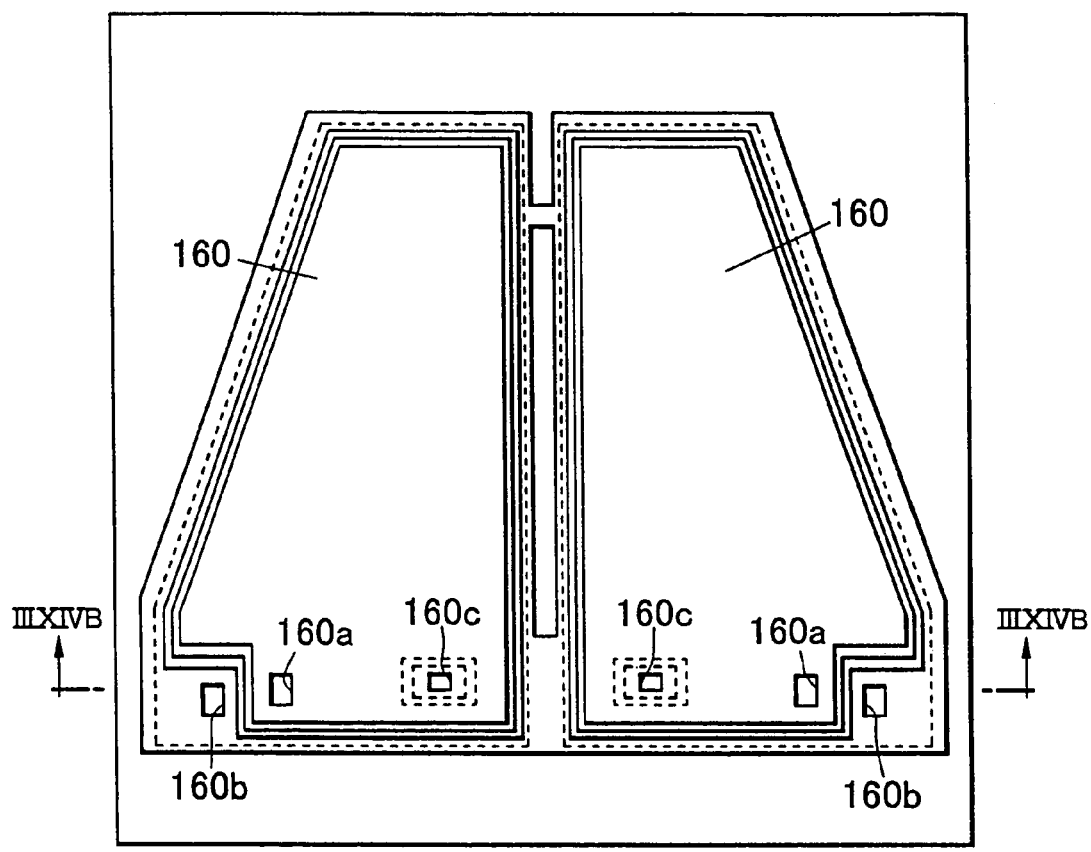
FIG. 34A is a plan view showing a process of forming an insulating layer 160 for covering an entire element in a manufacturing method of the third embodiment.
FIG. 34B is a sectional view showing a process of forming an insulating layer 160 for covering an entire element in a manufacturing method of the third embodiment.
Figure 34:
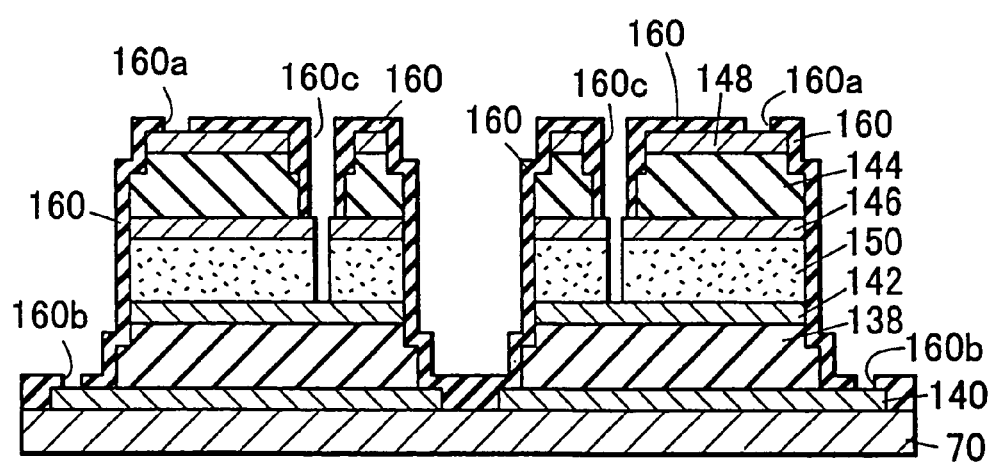
Figure 35:
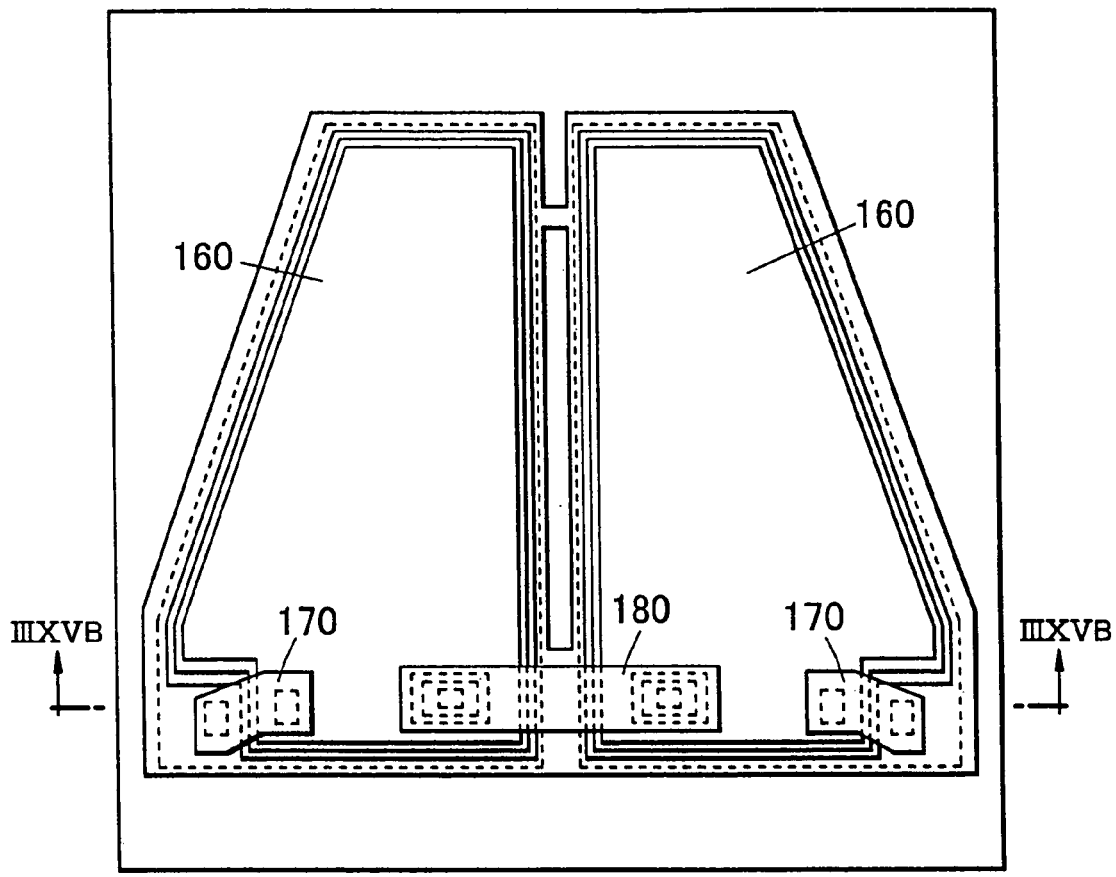
FIG. 35A is a plan view showing a process of forming a control electrode 170 and a common electrode 180 in a manufacturing method of the third embodiment.
FIG. 35B is a sectional view showing a process of forming a control electrode 170 and a common electrode 180 in a manufacturing method of the third embodiment.
Figure 35:
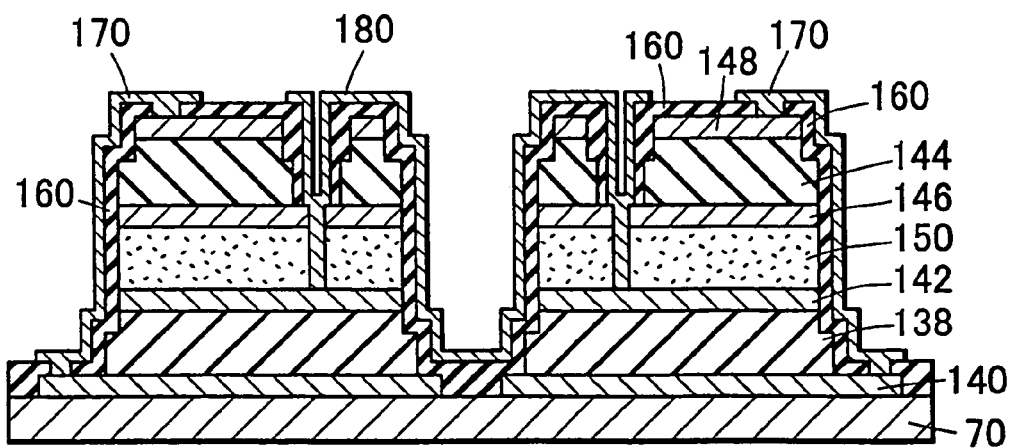

Next, the portion not forming the masks M10, M20 is removed by etching from the surface of the fourth electrode metal film 148 to the middle of the second piezoelectric thin-film 144 (FIG. 28A, B), and then the masks M10, M20 are peeled off (FIG. 29A, B).

Up to this point, the portion above the second step portion 144c in the piezoelectric elements V1, V2 is formed.

In FIGS. 28 to 35, B shows a sectional view along line b—b in A.

In the piezoelectric elements V1, V2, to form the portion above the first step 138c, masks M11, M21 are formed to cover the portion above the second step portion 144c and its periphery (the area corresponding to the second step portion 144), and the portion not forming the masks M11, M21 is removed by etching up to the middle of the first piezoelectric thin-film layer 138 (FIG. 30A, B), and the masks M11, M12 are peeled off.

In this process, the portion above the first step portion 138c is formed in the piezoelectric elements V1, V2. When forming the masks M11, V21, the width of the second step portion 144c is set at, for example, 5 μm by adjusting the dimensions of the masks M11, M21. Moreover, in the piezoelectric elements V1, V2, a notch 8k2 is formed at one end of the outside in order to form a control electrode 170 for connecting the first electrode metal film 140 and fourth electrode metal film 148.

Consequently, in the piezoelectric elements V1, V2, masks M12, M22 are formed to cover the portion above the first step portion 138c and its periphery (the area corresponding to the first step portion 138c) (FIG. 31A, B). These masks M12, M22 respectively have openings M12a, M22a for forming a recess 23a in the piezoelectric elements V1, V2. The portion not forming the masks M12, M22 is removed by etching until the surface of the first electrode metal film 140 is exposed (FIG. 31A, B).

Simultaneously, in this process, in the openings M12a, M22a of the masks M12, M22, removing up to the middle of the second piezoelectric thin-film 144, a recess H23a is formed (FIG. 31A, B).

To separate the first electrode metal film 140 in each one of the piezoelectric elements V1, V2, masks M13, M23 are formed. These masks M13, M23 have openings M13a, M23a opened in the central portion of the surface of the second piezoelectric thin-film 144 exposed to the bottom of the recess H23a (FIG. 32A, B).

By etching and removing the first electrode metal film 140 in the portion not forming the masks M13, M23, the piezoelectric elements V1, V2 are separated, and simultaneously by removing the second piezoelectric thin-film 144 opened in the openings M13a, M23a, a recess H23b is formed, and the surface of the third electrode metal film 146 is exposed in its bottom (FIG. 32A, B).

Outside of the recess H23b, a step portion S23a is formed as an electrode separation surface (inner electrode separation surface) to surround the recess H23b.

After peeling off the masks M13, M23, in the third electrode metal film 146 exposed by the openings M13a, M23a, a mask M440 is formed to form a through-hole TH23, and the through-hole TH23 penetrating through the adhesive layer 150 is formed (FIG. 33A, B).

The portion of the through-hole TH23 penetrating through the adhesive layer 150 and the opening portion (openings 160a, 160b) for connecting the first electrode metal film 140 and fourth electrode metal film 148 are removed and, an insulating film 160 for covering the entire element is formed (FIG. 34A, B).

After forming the insulating layer 160, a control electrode 170 for connecting the first electrode metal film 140 and fourth electrode metal film 148, and a common electrode 180 for connecting the second electrode metal film 142 and third electrode metal film 146 are formed (FIG. 35A, B).

In the actuator of the third embodiment having such configuration, its pair of piezoelectric elements V1, V2 respectively have a step portion 138c at the outer circumference of the first piezoelectric thin-film 138, and a step portion 144c at the outer circumference of the second piezoelectric thin-film 144. Therefore, side wall deposits adhered on the side wall in the manufacturing process to cause leak current can be electrically isolated by the step portion 138c and step portion 144c. Also in the actuator of the third embodiment, since the pair of piezoelectric elements V1, V2 respectively have a step portion S23a between the recess H23a and recess H23b, side wall deposits adhered on the side wall of the recess H23a and side wall deposits adhered on the side wall of the recess H23b can be electrically isolated by the step portion S23a.

Therefore, in the actuator A1 of the third embodiment, by the pair of piezoelectric elements V1, V2, leak current between the first electrode metal film 140 and second electrode metal film 142, and leak current between the third electrode metal film 146 and fourth electrode metal film 148 can be suppressed. Accordingly, in the actuator of the third embodiment, an actuator extremely small in leak current in the entire element can be presented.

Figure 36:
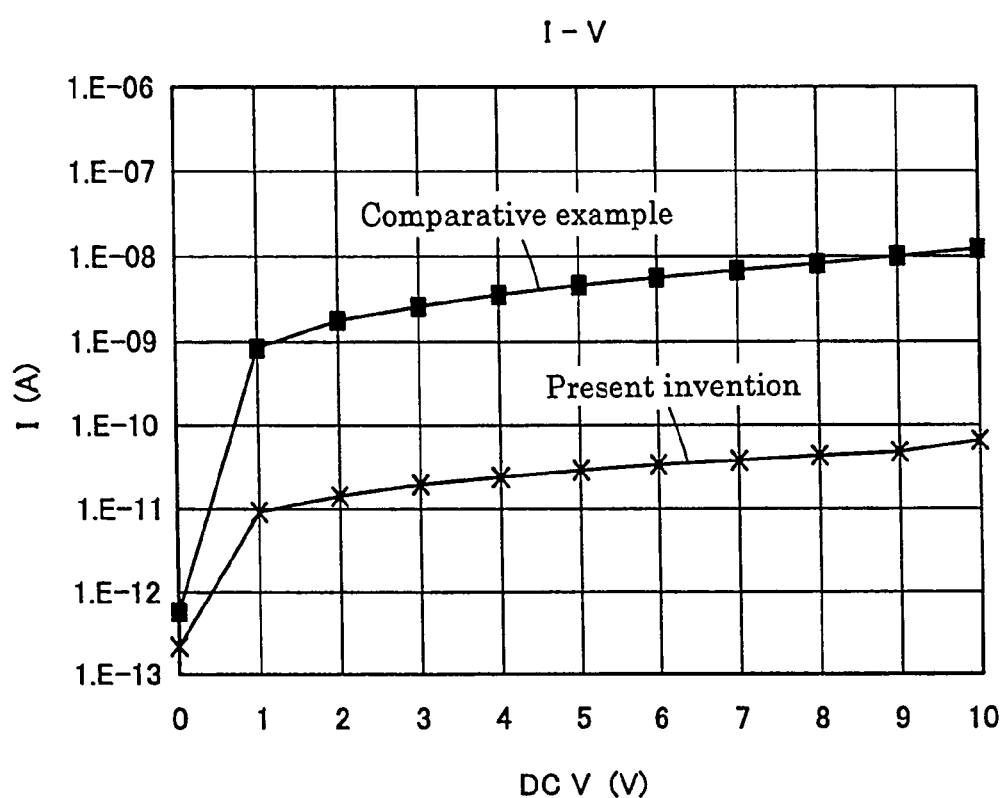
FIG. 36 is a graph showing the relation of voltage and leak current of the actuator in the third embodiment.

FIG. 36 is a graph showing leak current in relation to the voltage of the actuator of the third embodiment. In the actuator used in this measurement, the thickness of the first piezoelectric thin-film 138 and second piezoelectric thin-film 144 is 2.5 μm, and the width of the step portion 138c and step portion 144c is 5 μm. The area of the first to fourth electrode metal films is larger in the upper electrodes, but it is set at about 1.2 mm². In this measurement, the measuring voltage was increased from 1 to 10 V at 1 V increments, and each voltage was applied for 20 seconds continuously, and the current was measured at this point.

FIG. 36 also shows the leak current of a comparative example of an actuator formed without disposing step portion 138c and step portion 144c in the first piezoelectric thin-film 138 and second piezoelectric thin-film 144. That is, in the actuator of this comparative example, etching to expose the first electrode metal film 140 from the fourth electrode metal film 148 is executed by one consecutive etching process by using one mask only.

As shown in FIG. 36, in the actuator of the third embodiment having the step portion 138c and step portion 144c, the leak current can be lowered by about two digits as compared with the actuator of the comparative example formed by one etching process without forming the step portion 138c and step portion 144c.

<Mounting>

Figure 37:
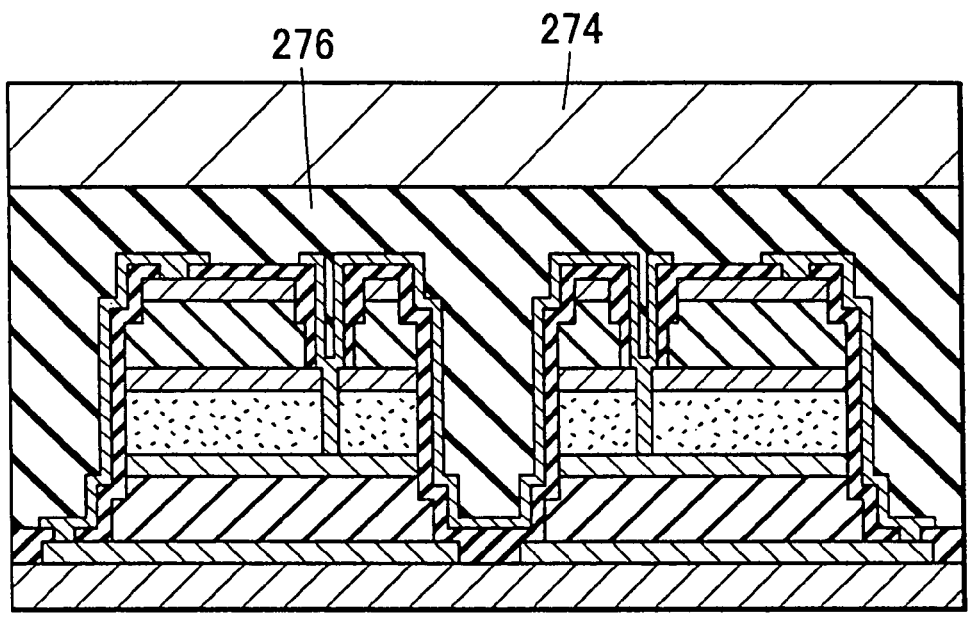
FIG. 37 is a sectional view (1) showing a process of transferring an actuator element of the third embodiment on a provisional fixing substrate.

The actuator element composed of a pair of piezoelectric elements V1, V2 formed on the substrate 70 is covered with a provisional adhesive 276 as shown in FIG. 37, and a provisional fixing substrate 274 is adhered with this provisional adhesive 276. This provisional adhesive 276 is required to have enough adhesion so that the provisional fixing substrate 274 may not be peeled off in the step of removing the substrate 70, and also enough property to withstand the chemical solution for etching and removing the substrate 70 or reactive gas in dry etching. As the provisional adhesive 276, for example, tar compound wax, acrylic adhesive, thermoplastic resin, or photo resist may be used.

Further, as the provisional fixing substrate 274, various materials can be used directly, such as glass, metal, ferrite, altic, (mixed ceramic of alumina and titanium carbide), other ceramic materials such as alumina. However, it is required to select a material not attacked by chemical solution or gas when removing the substrate 70, gas containing active seeds in dry etching, or gas partly ionized at the time of dry etching.

Figure 38:
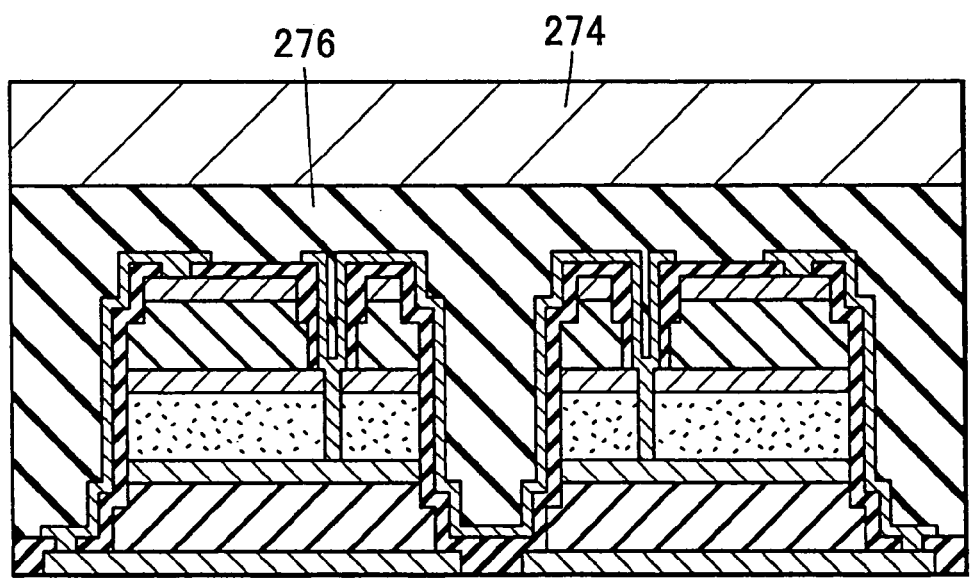
FIG. 38 is a sectional view (2) showing a process of transferring an actuator element of the third embodiment on a provisional fixing substrate.

Thus, after adhering the provisional fixing substrate 274, the substrate 70 is etched and removed by using a chemical solution (FIG. 38).

Next, in order that the plural actuators A1 arrayed on the provisional fixing substrate 274 may be separated from the provisional fixing substrate 274 while maintaining the configuration when held on the provisional fixing substrate 274, the provisional fixing substrate 274 provisionally fixing the plural actuators A1 is immersed in a solution containing a dissolving solution for dissolving the provisional adhesive 276, and the provisional adhesive 276 is dissolved.

To separate the plural actuator elements from the provisional fixing substrate 74 while keeping the configuration when mounted on the provisional fixing substrate 274, for example, a holding container forming a compartment (recess) corresponding to each actuator element arrayed on the provisional fixing substrate 74 may be used.

More specifically, in order to allow the solution to enter and leave the compartment freely, the holding container is made of, for example, mesh, and the actuators A1 are separated from the provisional fixing substrate 74 in the following manner.

That is, in order that each compartment may face the individual actuators arrayed on the provisional fixing substrate 74, the provisional fixing substrate 74 and holding container are matched, and the whole assembly is put in the container holding the dissolving solution with the holding container down.

When the provisional adhesive 276 is thus dissolved, the actuator elements are separated from the provisional fixing substrate 274, and the pair of piezoelectric elements V1, V2 are contained in the compartment of each holding container without separating.

Since the solution can freely invade into each compartment of the holding container, it is possible to clean and dry directly.

Besides, because of being arrayed in the holding container nearly in a same regular array state as in the array state formed on the substrate 70, the subsequent mounting process is easier.

As the dissolving solution, for example, when tar compound wax is used as the provisional adhesive 276, xylene may be used, or in the case of acrylic adhesive, an exclusive dissolving solution may be used.

Thus, the actuator elements composed of a pair of piezoelectric elements V1, V2 separated from the substrate 70 and arrayed in the holding container are mounted on a flex board 330 by using a mounting machine, and specified wiring is applied.

Thus, the actuator composed of a pair of piezoelectric elements V1, V2 is mounted on the flex board 330.

<Head Positioning Operation>

In a magnetic disk recording and reproducing apparatus, positioning operation by using the actuator of the third embodiment is explained below.

Figure 39:
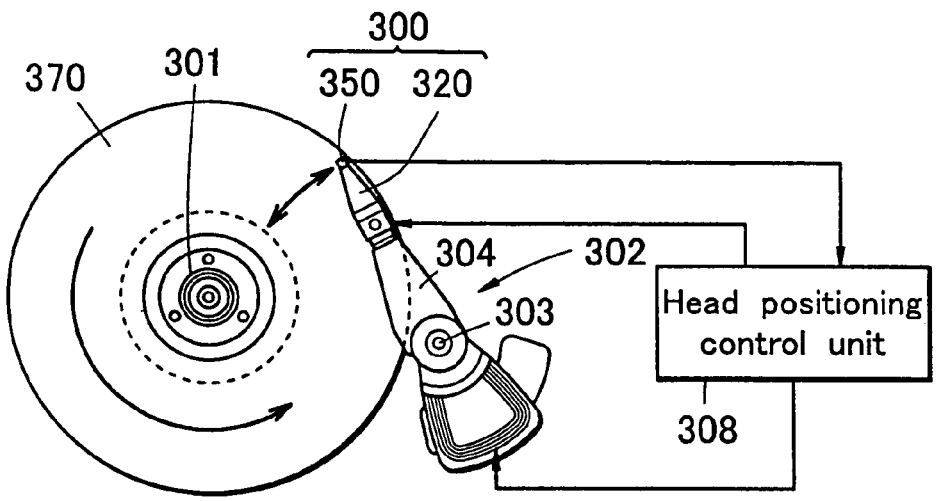
FIG. 39 is a schematic diagram showing an outline of a configuration of a magnetic disk apparatus.

FIG. 39 is a schematic diagram showing an outline configuration of a magnetic disk device, and in FIG. 39, reference numeral 370 is a magnetic disk, 301 is a spindle motor for rotating the magnetic disk 370 at high speed, and 302 is a head actuator. The head actuator 302 has an actuator arm 304, and a head support mechanism 300 composed of a slider support beam 320 and a slider 350 is provided at the leading end of the actuator arm 304.

Figure 40:
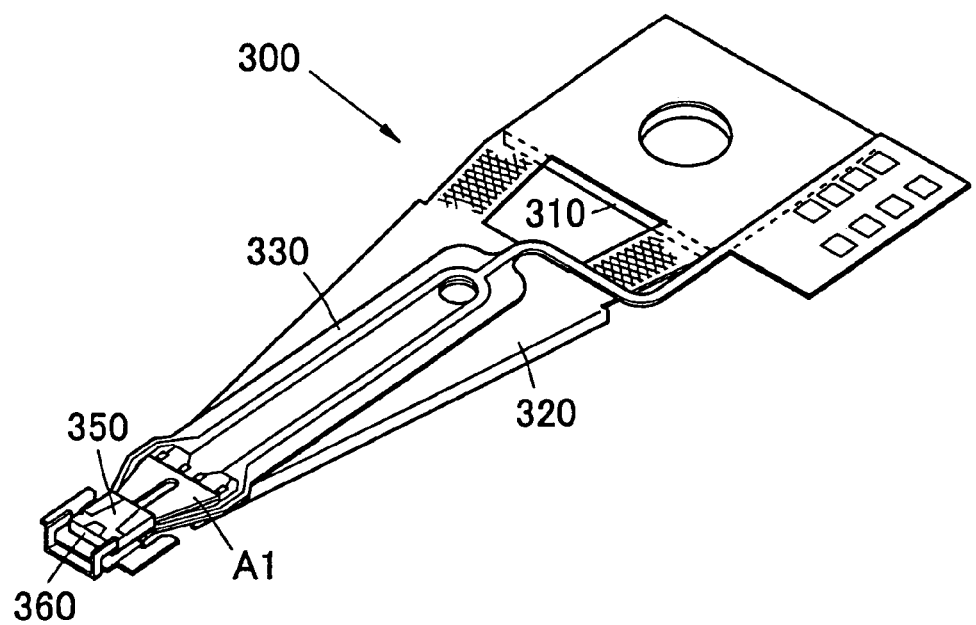
FIG. 40 is a perspective view showing a configuration of a head support mechanism of a magnetic disk apparatus.
Figure 41:
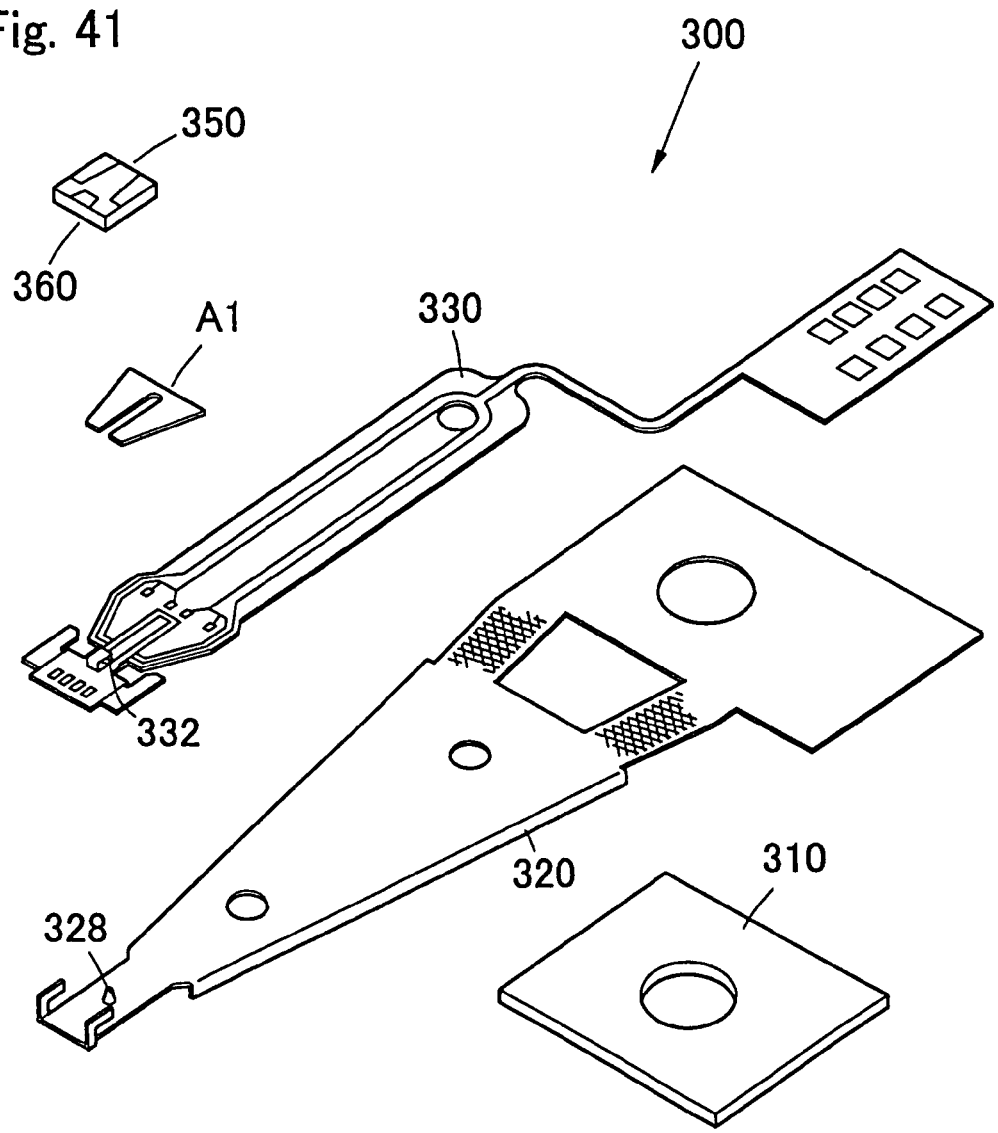
FIG. 41 is a perspective exploded view showing a configuration of the head support mechanism of the magnetic disk apparatus.

The head support mechanism 300 comprises, as shown in FIG. 40 and FIG. 41, a base plate 310, a load beam 320, a flex board 330, and actuator A1 composed of piezoelectric elements V1, V2, a slider 350, and a magnetic head 360. Herein, the base plate 310 is for mounting on the actuator arm 304, and the load beam 320 is fixed to the base plate 310. At the leading end of the load beam 320, a protrusion 328 is provided as the center of rotation of the slider 350. A slider support member 332 is rotatably supported on the protrusion 328, and the slider 350 mounting the head 360 is fixed on the slider support member 332. Between the slider 350 and slider support member 332, the leading end portion of the flex board 330 is fixed, and the actuator composed of a pair of piezoelectric elements V1, V2 is provided on the flex board 330 immediately before the slider 350.

In the head support mechanism thus composed, the actuator composed of a pair of piezoelectric elements V1, V2 positions the head at high precision by rotating the slider 350 (FIG. 40B) on which the head 360 is mounted by allowing expanding and contracting motion of the piezoelectric elements V1, V2 according to a control signal supplied from a head positioning control unit 308.

On the flex board 330, wiring for connecting to the head 360 and piezoelectric elements V1, V2 is formed.

Fourth Embodiment

An actuator of a fourth embodiment of the invention is similar to the actuator of the third embodiment in basic structure, but what differs from the actuator of the third embodiment lies in the connection portion of the second electrode metal film 142 and the third electrode metal film 146 in each piezoelectric element. That is, the actuator of the fourth embodiment is an actuator used for positioning the head slider of a magnetic disk recording and reproducing apparatus at a specified track position on a disk at high precision, and is similar to the actuator of the third embodiment in the following points: (1) a pair of piezoelectric elements V1, V2 fabricated by applying the manufacturing method explained in the first and second embodiments are used, and (2) the two right and left symmetrical piezoelectric elements V1, V2 are formed by laminating two piezoelectric thin-film elements V11 (V21), V12 (V22) so as to obtain a greater displacement.

A manufacturing method of the actuator of the fourth embodiment is explained below.

In the manufacturing method of the actuator of the fourth embodiment, the process up to formation of the portion above the second step portion 144c of the piezoelectric elements V1, V2 (FIGS. 26 to 29) is the same as in the manufacturing method of the actuator of the third embodiment, and therefore the explanation is omitted.

In the following explanation and drawings, the same parts as in the third embodiment are identified with the same reference numerals.

Figure 42:
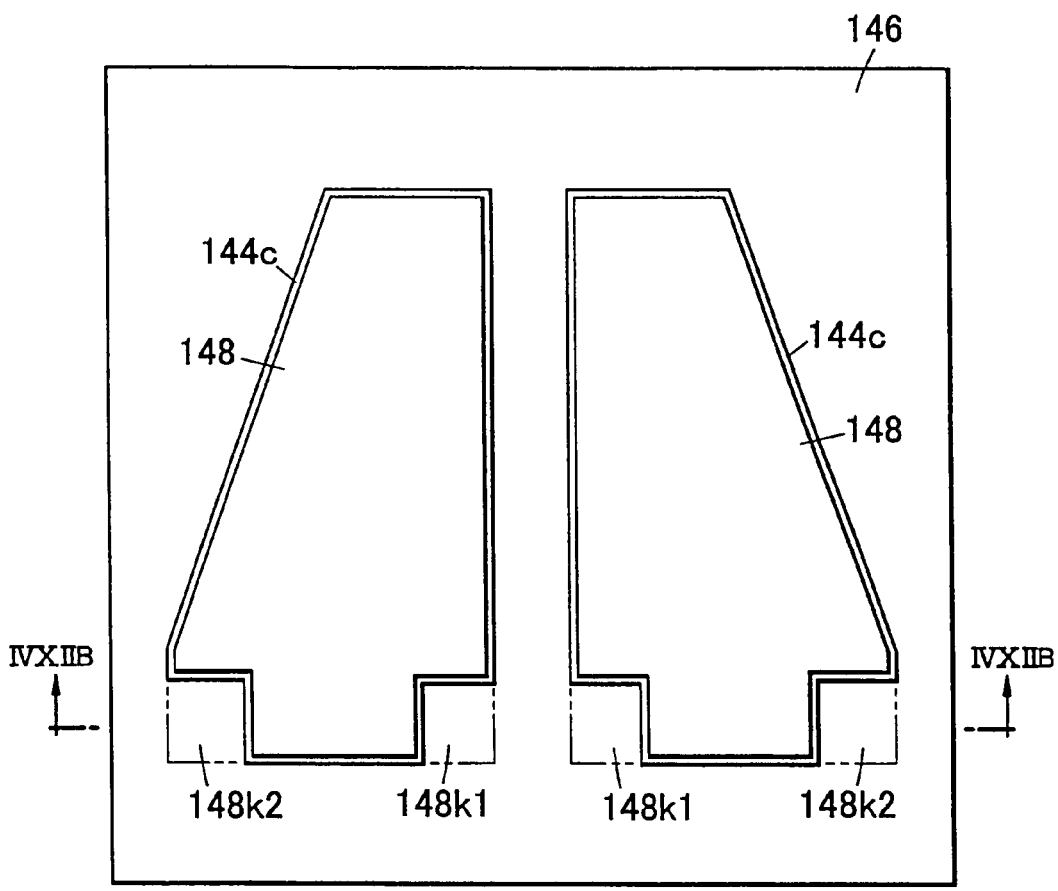
FIG. 42A is a plan view for explaining a process of forming a portion above a third electrode metal film of piezoelectric elements V1, V2 in a manufacturing method of the actuator in a fourth embodiment.
FIG. 42B is a sectional view for explaining a process of forming a portion above a third electrode metal film of piezoelectric elements V1, V2 in a manufacturing method of the actuator in a fourth embodiment.
Figure 42:
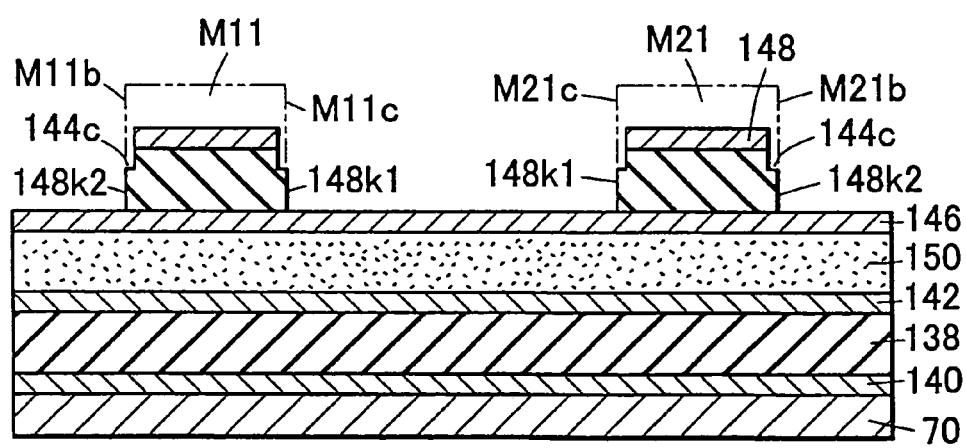

After forming the portion above the second step portion 144c of the piezoelectric elements V1, V2, masks M11, M21 to cover the portion above the second step 144c and the second step 144c are formed, and a part of the second piezoelectric thin-film layer 144 which is not covered by the masks M11, M21 is etched until the third electrode metal film 146 is exposed (FIG. 42 A, B). As a result, the second piezoelectric thin-film layer 144 is processed in a specified shape. In the piezoelectric elements V1, V2, the second piezoelectric thin-film layer 144 has a notch 148k2 for forming a control electrode 170 for connecting the first electrode metal film 140 and fourth electrode metal film 148, and a notch 148k1 for forming a through-hole TH23 for connecting the second electrode metal film 142 and third electrode metal film 146.

Figure 43:
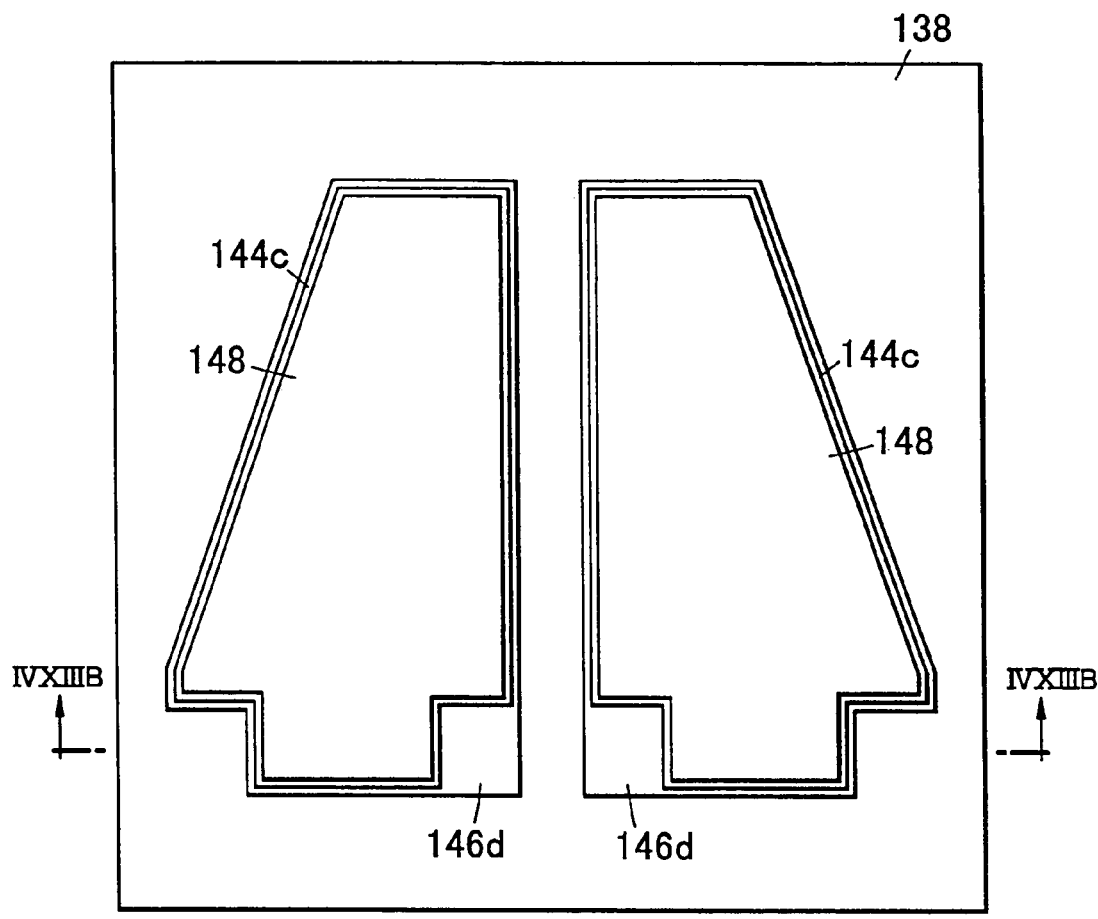
FIG. 43A is a plan view for explaining a process of forming a portion above a first step portion 138c of piezoelectric elements V1, V2 in a manufacturing method of the fourth embodiment.
FIG. 43B is a sectional view for explaining a process of forming a portion above a first step portion 138c of piezoelectric elements V1, V2 in a manufacturing method of the fourth embodiment.
Figure 43:
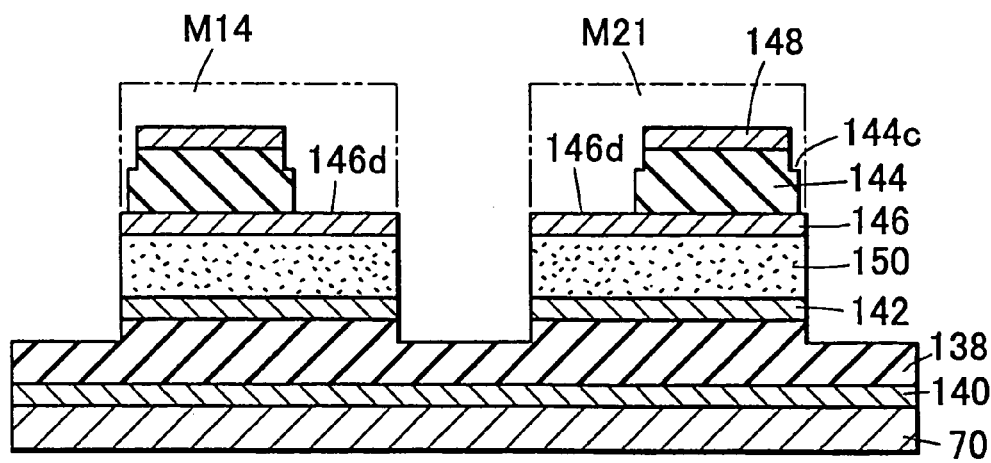
Figure 44:
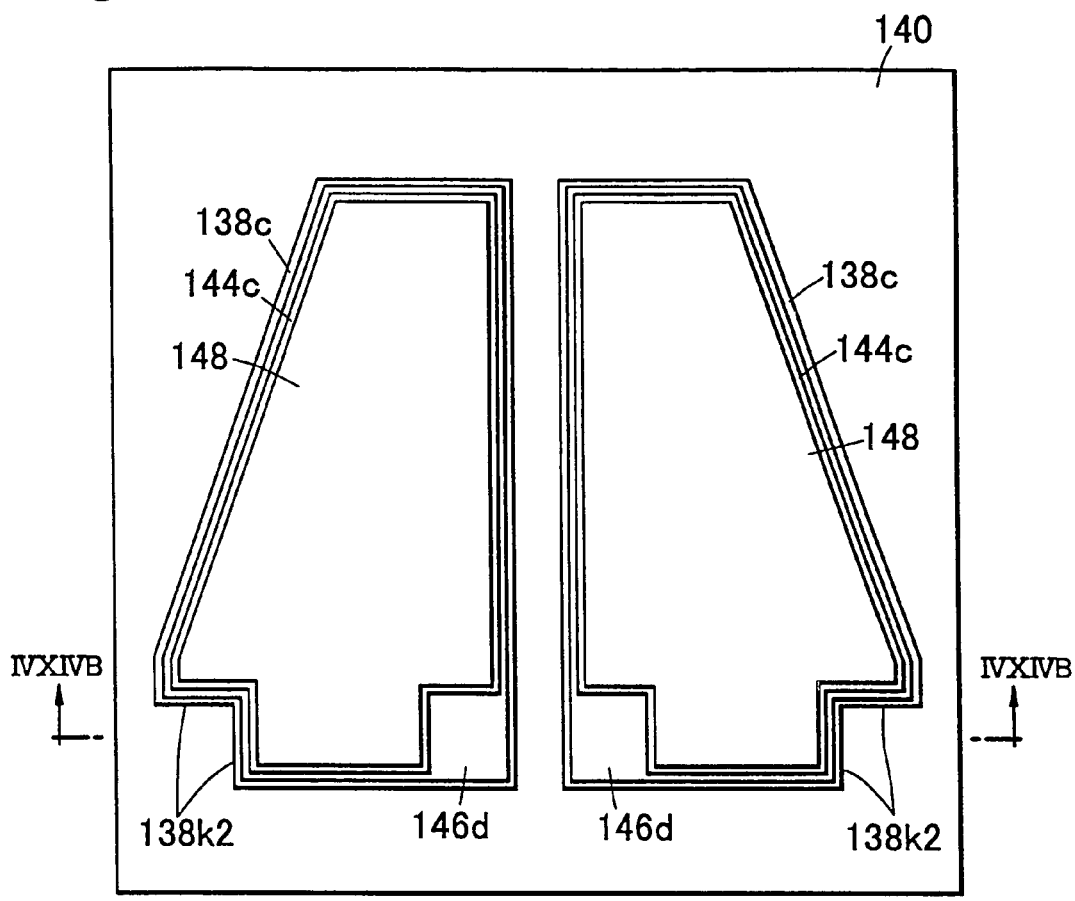
FIG. 44A is a plan view for explaining a process of forming a portion above a first electrode metal film of piezoelectric elements V1, V2 in a manufacturing method of the fourth embodiment.
FIG. 44B is a sectional view for explaining a process of forming a portion above a first electrode metal film of piezoelectric elements V1, V2 in a manufacturing method of the fourth embodiment.
Figure 44:
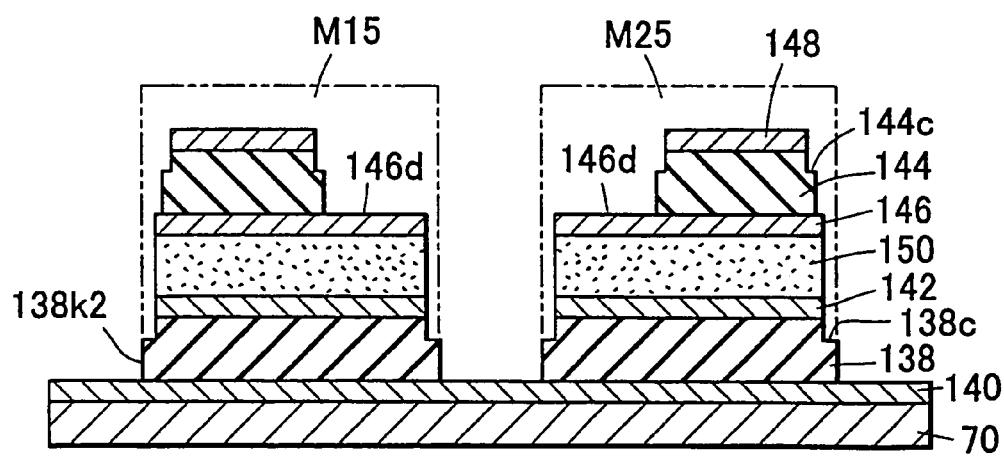
Figure 45:
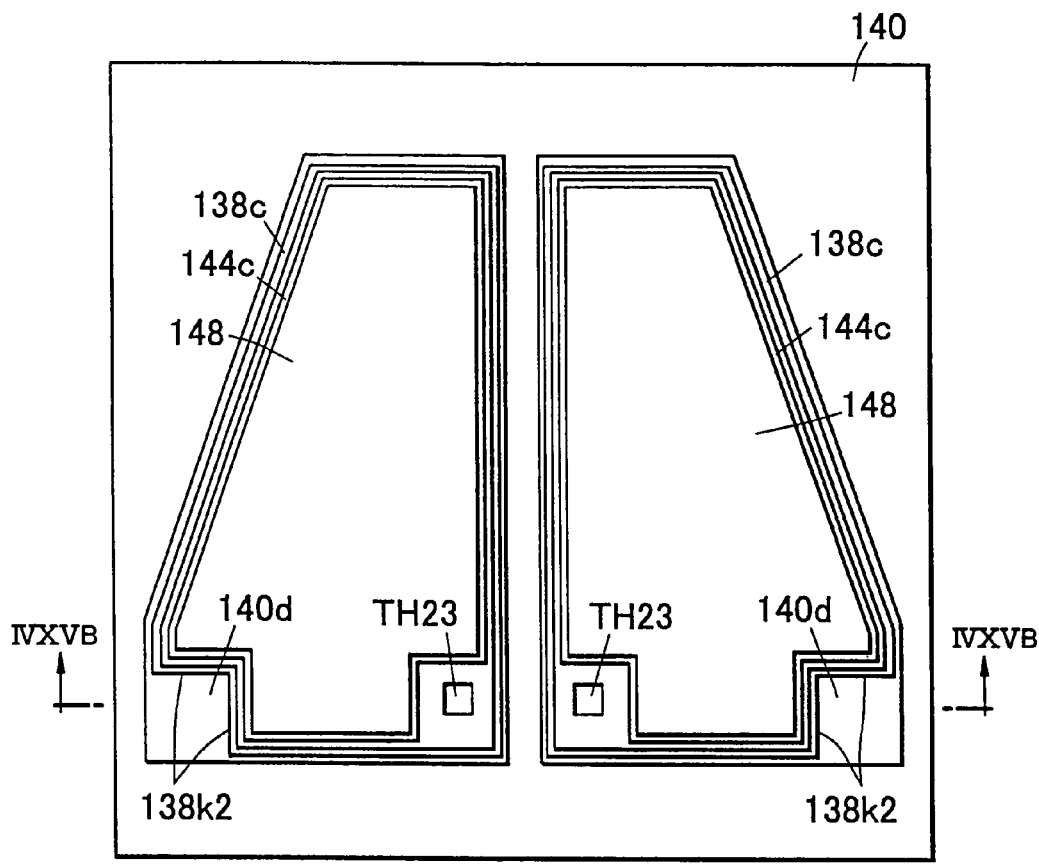
FIG. 45A is a plan view showing a completed state of processing of the first electrode metal film of piezoelectric elements V1, V2 in a manufacturing method of the fourth embodiment.
FIG. 45B is a sectional view showing a completed state of processing of the first electrode metal film of piezoelectric elements V1, V2 in a manufacturing method of the fourth embodiment.
Figure 45:
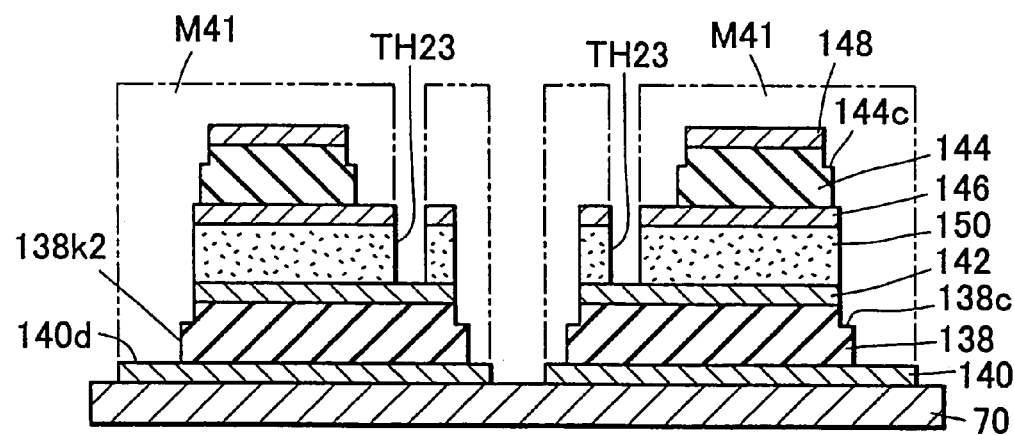

After peeling off the masks M11, M21, masks M14, M24 for covering the processed second piezoelectric thin-film layer 144 and its periphery (for example, periphery in a width of 5 μm) are formed, and the portion not forming the masks M14, M24 is etched to the middle of the first piezoelectric thin-film layer 138 (FIG. 43 A, B). By this etching, in the piezoelectric elements V1, V2, the portion above the first step portion 138c is formed. At this time, the masks M14, M24 cover only the periphery near (for example, ≦5 μm) the second thin-film dielectric layer 148 in the notch 148k2, and cover the entire notch 148k1 in the notch 148k1. As a result, in the notch 148k1, the third electrode metal film 146 for forming a through-hole TH23 connecting the second electrode metal film 142 is provided, in which the third electrode metal film 146 is exposed.

After removing the masks M14, M24, in the piezoelectric elements V1, V2, masks M15, M25 covering the portion above the first step portion 138c and its peripheral vicinity are formed, and the first piezoelectric thin-film layer 138 in the portion not forming the mask is etched until the surface of the first electrode metal film 140 is exposed. These masks M15, M25 are formed to cover only the periphery near (for example, ≦5 μm) the second thin-film dielectric layer 144 also in the notch 148k2 of the second piezoelectric thin-film layer 148. As a result, in the first piezoelectric thin-film layer 138, a notch 138k2 corresponding to the notch 148k2 is formed. By this etching step, the portion above the first electrode metal film 140 in the piezoelectric elements V1, V2 is formed. Between the notch 148k2 and the notch 138k2, there is a step portion of about 5 μM in width as an electrode separation surface orthogonal to the dry etching direction.

After removing the masks M15, M25, a mask M41 is formed for processing the shape of the first electrode metal film 140 in the piezoelectric elements V1, V2, and the portion not forming the mask M41 is etched until the substrate 70 is exposed. The mask M41 is formed to cover the entire notched portion in the notch 138k2, and the mask M41 has an opening for forming a through-hole TH23 in the region 146d before etching. By forming the mask M41 in such manner, the contour of the first electrode metal film in the piezoelectric elements V1, V2 is processed, and the through-hole TH23 for penetrating through the insulating layer 150 in the region 146d is formed, and also in the notch 138k2, the first electrode metal film 140 is exposed in a rectangular shape, and a region 140d is formed. This region 140d is utilized as an area for forming a control electrode 170.

Figure 46:
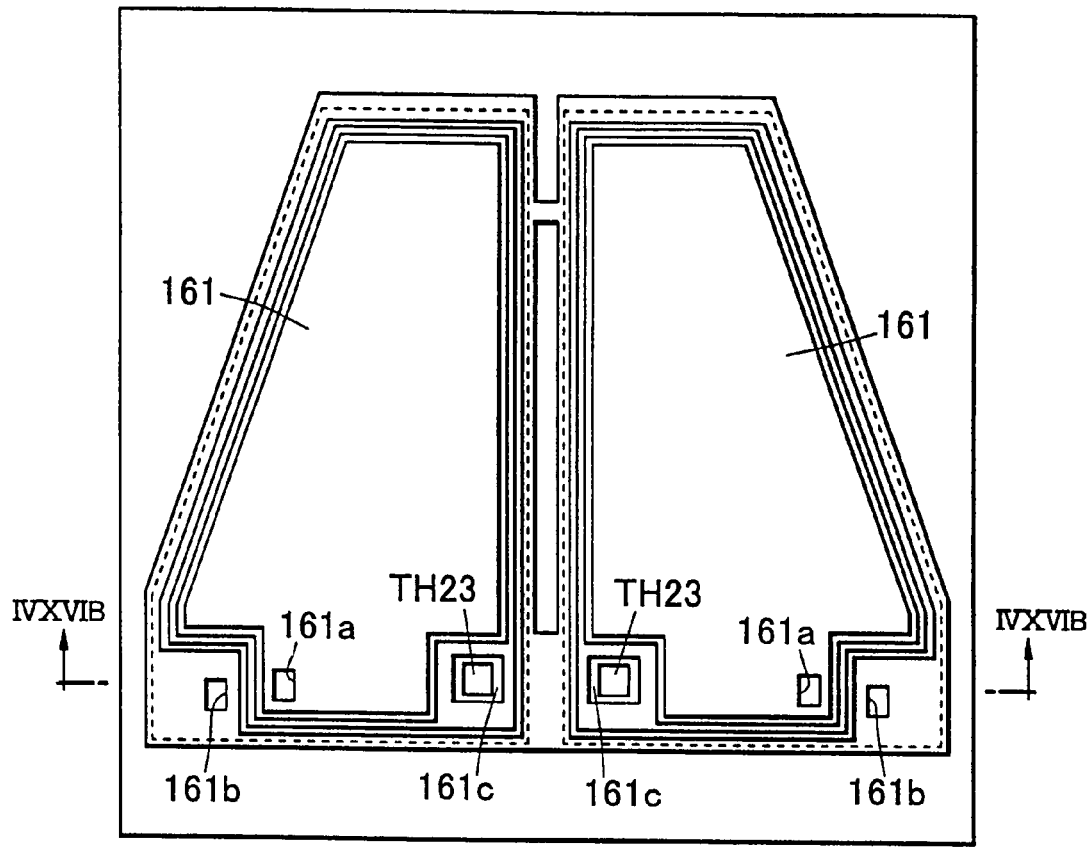
FIG. 46A is a plan view for explaining a process of forming an insulating film 160 for covering an entire element in a manufacturing method of the fourth embodiment.
FIG. 46B is a sectional view for explaining a process of forming an insulating film 160 for covering an entire element in a manufacturing method of the fourth embodiment.
Figure 46:
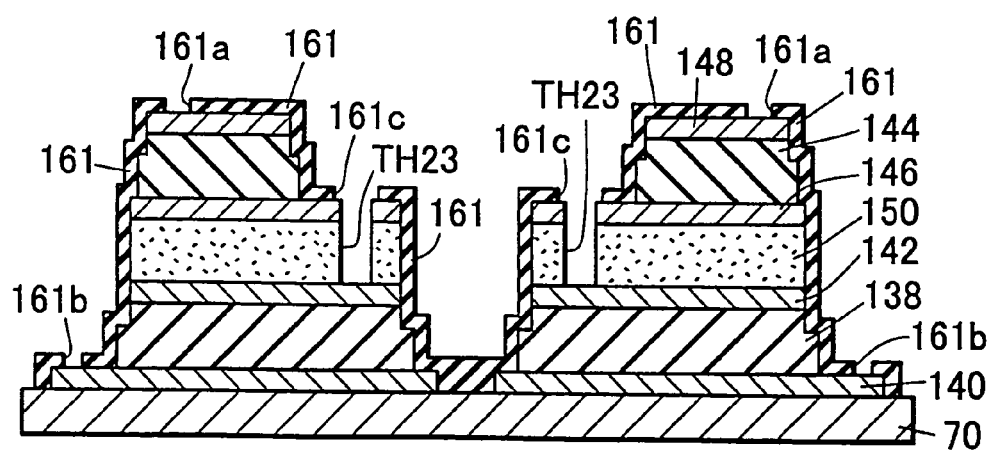

An insulating film 161 is formed to cover the entire element, except the opening 161c for opening the portion of the through-hole TH23 for penetrating through the adhesive layer 150, and opening portion (opening 161a, 161b) for connecting the first electrode metal film 140 and the fourth electrode metal film 148 (FIG. 46A, B).

Figure 47:
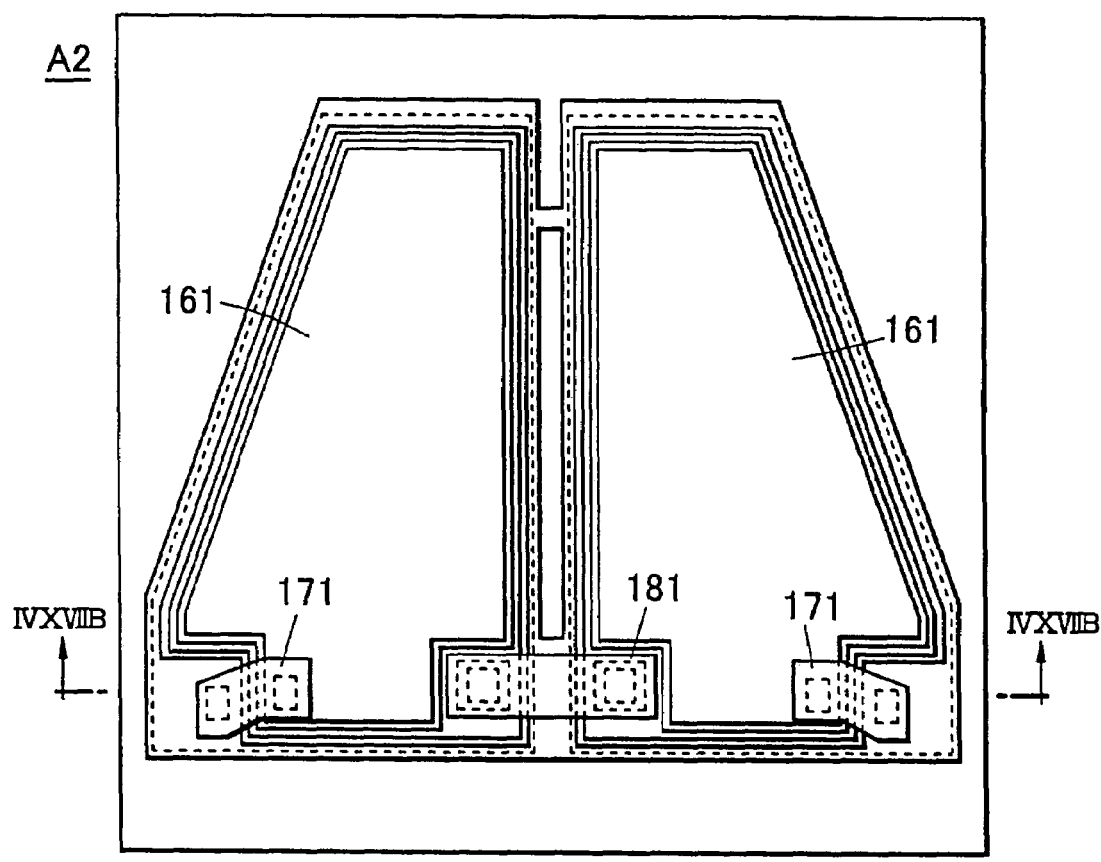
FIG. 47A is a plan view for explaining a process of forming a control electrode 170 and a common electrode 180 in a manufacturing method of the fourth embodiment.
FIG. 47B is a sectional view for explaining a process of forming a control electrode 170 and a common electrode 180 in a manufacturing method of the fourth embodiment.
Figure 47:
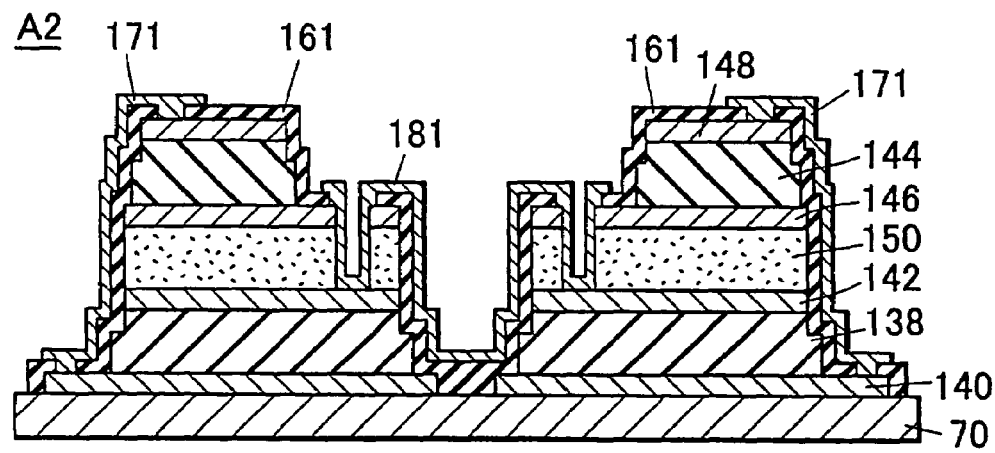

After forming the insulating layer 161, a control electrode 171 for connecting the first electrode metal film 140 and the fourth electrode metal film 148, and a common electrode 181 for connecting the second electrode metal film 142 and the third electrode metal film 146 are formed (FIG. 47A, B).

An actuator A2 of the fourth embodiment thus composed has, same as in the third embodiment, a step portion 138c at the outer circumference of the first piezoelectric thin-film 138, and a step portion 144c at the outer circumference of the second piezoelectric thin-film 144, in the pair of piezoelectric elements V1, V2. Therefore, side wall deposits as the cause of leak current adhered on the side walls in the manufacturing process can be electrically isolated by the step portion 138c and step portion 144c. In the actuator A2 of the fourth embodiment, moreover, the pair of piezoelectric elements V1, V2 have a step portion as the electrode separation surface orthogonal to the dry etching direction between the notch 148k2 and the notch 138k2, and hence the side wall deposits adhered on the side walls of the notch 148k2 and the notch 138k2 can be electrically isolated by the step portion.

Therefore, the actuator A2 of the fourth embodiment, in its pair of piezoelectric elements V1, V2, can suppress the leak current between the first electrode metal film 140 and the second electrode metal film 142, and the leak current between the third electrode metal film 146 and fourth electrode metal film 148. As a result, the actuator A2 of the fourth embodiment realizes an actuator of an extremely small leak current in the entire element.

As described herein, according to the piezoelectric thin-film element of the invention, since a peripheral region exposing the piezoelectric thin-film is formed on the top of the piezoelectric thin-film, side deposits of the piezoelectric thin-film element are separated by this peripheral region. As a result, the electrode metal films formed on both surfaces of the piezoelectric thin-film are not short-circuited through side wall deposits, and the insulation between the electrode metal films can be enhanced, so that the reliability of the piezoelectric thin-film element can be enhanced.

The invention may also provide an actuator of small leak current and high reliability.

The invention claimed is:
1. A piezoelectric thin-film element comprising;
   a first unit laminated body composed of a first piezoelectric thin-film having a first surface and a second surface opposed each other, a first electrode metal film on said first surface and a second electrode film on said second surface, and a second unit laminated body composed of a second piezoelectric thin-film having a third surface and a fourth surface opposed each other, a third electrode metal film on said third surface and a fourth electrode film on said fourth surface, said first unit laminated body and said second unit laminated body being bonded to each other, with said second electrode metal film and said third electrode metal film opposite to each other, wherein said first unit laminated body has a first electrode separation surface between said first electrode metal film and said second electrode metal film, said first electrode separation surface being parallel to said first surface, wherein said second unit laminated body has a second electrode separation surface between said third electrode metal film and said fourth electrode metal film, said second electrode separation surface being parallel to said first surface.

2. The piezoelectric thin-film element according to claim 1, wherein said second electrode metal film and said third electrode metal film are bonded by an insulating adhesive layer, and said second electrode metal film and said third electrode metal film are connected by using a through-hole formed in said adhesive layer.

3. The piezoelectric thin-film element according to claim 2, wherein said through-hole is formed in a recess provided by removing said fourth electrode metal film and said second piezoelectric thin-film so as to reach up to said third electrode metal film, said recess having an electrode separation surface parallel to said third surface at the inner circumferential side face of said second piezoelectric thin-film.

4. The piezoelectric thin-film element according to claim 2, wherein said through-hole is formed in a notch provided by removing said fourth electrode metal film and said second piezoelectric thin-film so as to reach up to said third electrode metal film, said notch having an electrode separation surface parallel to said third surface at the side face of the second piezoelectric thin-film.

5. An actuator comprising a pair of piezoelectric elements expanding and contracting in mutually parallel directions, each of said piezoelectric elements comprising;

a first unit laminated body composed of a first piezoelectric thin-film having a first surface and a second surface opposed each other, a first electrode metal film on said first surface and a second electrode film on said second surface, and a second unit laminated body composed of a second piezoelectric thin-film having a third surface and a fourth surface opposed each other, a third electrode metal film on said third surface and a fourth electrode film on said fourth surface, said first unit laminated body and said second unit laminated body being bonded to each other, with said second electrode metal film and said third electrode metal film opposite to each other, wherein each of said first unit laminated bodies has a first electrode separation surface between said first electrode metal film and said second electrode metal film, said first electrode separation surface being parallel to said first surface, wherein each of said second unit laminated bodies has a second electrode separation surface between said third electrode metal film and said fourth electrode metal film, said second electrode separation surface being parallel to said first surface.

6. The actuator according to claim 5, wherein said second electrode metal film and said third electrode metal film are bonded by an insulating adhesive layer, and said second electrode metal film and said third electrode metal film are connected by using a through-hole formed in said adhesive layer.

7. The actuator element according to claim 6, wherein said through-hole is formed in a recess provided by removing said fourth electrode metal film and said second piezoelectric thin-film so as to reach up to said third electrode metal film, said recess having an electrode separation surface parallel to said third surface at the inner circumferential side face of said second piezoelectric thin-film.

8. The actuator according to claim 6, wherein said through-hole is formed in a notch provided by removing said fourth electrode metal film and said second piezoelectric thin-film so as to reach up to said third electrode metal film, said notch having an electrode separation surface parallel to said third surface at the side face of said second piezoelectric thin-film.

9. The actuator according to claim 6, wherein it is designed to connect between an electrode metal film for connecting said second electrode metal film and said third electrode metal film formed in said through-hole in one of the pair of piezoelectric element, and an electrode metal film for connecting said second electrode metal film and said third electrode metal film formed in said through-hole in the other piezoelectric element.

* * * * *